United States Patent [19]
Ushida

[11] Patent Number: 5,987,623
[45] Date of Patent: *Nov. 16, 1999

[54] TERMINAL MAPPING APPARATUS

[75] Inventor: Yoichi Ushida, Tokyo, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/824,515

[22] Filed: Mar. 26, 1997

[30] Foreign Application Priority Data

Apr. 11, 1996 [JP] Japan .................................. 8-089137

[51] Int. Cl.$^6$ .............................. G11C 17/00; G06F 11/20
[52] U.S. Cl. ..................... 714/6; 714/7; 714/8; 365/201; 365/63
[58] Field of Search .......................... 395/182.04, 182.05, 395/182.06; 365/200, 201, 63, 189.01; 714/6, 7, 8

[56] References Cited

U.S. PATENT DOCUMENTS

| | | | |
|---|---|---|---|
| 3,845,476 | 10/1974 | Boehm | 365/200 |
| 4,656,605 | 4/1987 | Clayton | 365/52 |
| 4,884,237 | 11/1989 | Mueller et al. | 365/63 |
| 4,992,984 | 2/1991 | Busch et al. | 365/200 |
| 5,051,994 | 9/1991 | Bluethman et al. | 395/182.06 |
| 5,199,033 | 3/1993 | McGeoch et al. | 395/182.05 |
| 5,208,782 | 5/1993 | Sakuta et al. | 365/230.03 |
| 5,278,793 | 1/1994 | Yeh | 365/200 |
| 5,504,373 | 4/1996 | Oh et al. | 257/734 |

*Primary Examiner*—Ly V. Hua
*Attorney, Agent, or Firm*—Rabin & Champagne, P.C.

[57] ABSTRACT

A memory module comprises a plurality of memory chips, data input/output terminals, and switching means. One word in a memory chip comprises a plurality of bits, and each memory chip includes a number of input/output terminals corresponding to one word. The number of data input/output terminals is less than the total number of input/output terminals of the memory chips. Switching means switches a connection between input/output terminals of the memory chips and data input/output terminals. Only those input/output terminals of the memory chips which are connected to non-defective bits are connected to the data input/output terminals.

14 Claims, 18 Drawing Sheets

FIG. 5

TRUTH TABLE FOR RECORDER

| A | B | G | Y1 | Y2 | Y3 |
|---|---|---|----|----|----|
| 0 | 0 | 0 | 0  | 0  | 0  |
| 0 | 1 | 0 | 1  | 0  | 0  |
| 1 | 0 | 0 | 0  | 1  | 0  |
| 1 | 1 | 0 | 0  | 0  | 1  |
| X | X | 1 | 1  | 1  | 1  |

FIG. 6

TRUTH TABLE FOR RECORDER

| A | G | Y |
|---|---|---|
| 0 | 0 | 1 |
| 1 | 0 | 0 |
| 0 | 1 | 1 |
| 1 | 1 | 1 |

FIG.11

TRUTH TABLE OF SELECTION CIRCUIT

| n | A1 | A2 | A3 | A4 | G | Y0 | Y1 | Y2 | Y3 | Y4 | Y5 | Y6 | Y7 | Y8 |
|---|----|----|----|----|----|----|----|----|----|----|----|----|----|-----|
| 0 | 0 | 0 | 0 | 0 | 0 | 0 | 1 | 1 | 1 | 1 | 1 | 1 | 1 | 1 |
| 1 | 1 | 0 | 0 | 0 | 0 | 1 | 0 | 1 | 1 | 1 | 1 | 1 | 1 | 1 |
| 2 | 0 | 1 | 0 | 0 | 0 | 1 | 1 | 0 | 1 | 1 | 1 | 1 | 1 | 1 |
| 3 | 1 | 1 | 0 | 0 | 0 | 1 | 1 | 1 | 0 | 1 | 1 | 1 | 1 | 1 |
| 4 | 0 | 0 | 1 | 0 | 0 | 1 | 1 | 1 | 1 | 0 | 1 | 1 | 1 | 1 |
| 5 | 1 | 0 | 1 | 0 | 0 | 1 | 1 | 1 | 1 | 1 | 0 | 1 | 1 | 1 |
| 6 | 0 | 1 | 1 | 0 | 0 | 1 | 1 | 1 | 1 | 1 | 1 | 0 | 1 | 1 |
| 7 | 1 | 1 | 0 | 0 | 0 | 1 | 1 | 1 | 1 | 1 | 1 | 1 | 0 | 1 |
| 8 | 0 | 0 | 0 | 1 | 0 | 1 | 1 | 1 | 1 | 1 | 1 | 1 | 1 | 0 |
|   | X | X | X | X | 1 | 1 | 1 | 1 | 1 | 1 | 1 | 1 | 1 | 1 |

FIG.16A

Table 1

| BIT No. | NON-DEFECTIVE ? | N |
|---|---|---|
| 0 | O | 1 |
| 1 | X | 2 |
| 2 | X | 3 |
| 3 | O | 4 |
| 4 | O | 5 |
| 5 | X | 6 |
| 6 | X | 7 |
| 7 | O | 8 |

FIG.16B

Table 2

| BIT No. | NON-DEFECTIVE ? | L |
|---|---|---|
| 0 | X |  |
| 1 | O | 2 |
| 2 | X |  |
| 3 | O | 4 |
| 4 | O | 5 |
| 5 | O | 6 |
| 6 | X |  |
| 7 | X |  |

FIG.16C

Table 3

| N | A(N) |
|---|---|
| 1 | 0 |
| 2 | 2 |
| 3 | 4 |
| 4 | 0 |
| 5 | 0 |
| 6 | 5 |
| 7 | 6 |
| 8 | 0 |

1

TERMINAL MAPPING APPARATUS

FIELD OF THE INVENTION

The present invention relates to a memory module including a plurality of memory chips (such as RAM's, SRAMs or the like) formed on a printed circuit board configured to define a circuit connection with various signal terminals for connection with an external circuit, and in particular, to a memory module which can be constructed using memory chips which contain defective bits.

BACKGROUND OF THE INVENTION

In the prior art practice, a memory module is used including a plurality of memory chips mounted on a printed circuit board in order to facilitate changing a memory arrangement (capacity, bit configuration or the like) in an information processing system such as a personal computer, work station, or the like. There are a variety of memory modules. For example, U.S. Pat. No. 4,656,605 discloses a SIMM (Single Inline Memory Module) containing nine memory chips mounted on a rectangular printed circuit board having thirty terminals on a side.

A SIMM containing memory chips mounted on a rectangular printed circuit board which is formed with a card edge connector including 30 or 72 pins on a side, a DIMM (Dual Inline Memory Module) containing memory chips mounted on a printed circuit board which is formed with a dual surface card edge connector having 168 pins on a side, or a memory module such as a memory card of a size comparable to a credit card and in which memory chips are mounted are commonly in use.

A trend toward a higher level of integration, a greater capacity and a higher level of functionality is increasing from year to year in memory chips which are used in such memory modules. Accordingly, a technical requirement imposed upon such a memory chip during its manufacture is becoming stringent. Since it is premised that such a memory chip is generally used as a memory structured as N words (where N is a power of 2 such as 256 kilowords ($2^{18}$), 1 megawords ($2^{20}$) or the like)×I bits, if there is a defect even in one of the bits, the resulting memory is not capable of storing N words×I bits information, and thus becomes a faulty component.

To accommodate for this, it is known to provide a memory chip with redundant bits, and in the manufacture of the memory chip, defective bits are replaced with redundant bits by switching of switching circuit or by breakage of fuses. With such a memory chip, the presence of a defective bit or bits is detected during the manufacture, and the detected defective bit or bits are replaced by redundant bits. In this manner, a memory chip containing a defective bit or bits can be converted into a non-faulty component, thus improving the yield of memory chips.

However, if an arrangement for replacement of defective bits by redundant bits is provided, an external switching through a switching circuit cannot take place after the memory chip is packaged, because a control terminal which is used in controlling a switching operation by a switching circuit is generally not connected to the outside of the package. Thus, if the presence of defective bits in the memory chip is found subsequent to packaging, the memory chip cannot be repaired even though the remedy of such defect is within the allowance that can be achieved through the switching operation.

While it is difficult to repair such a defective memory chip when it is treated as a single component, a memory chip containing a certain number of defective bits can be used when a plurality of memory chips mounted on a printed circuit board constitute the memory module, by avoiding the use of defective bits through a switching circuit which is provided on the printed circuit.

In a memory module, it is difficult to provide a complex switching circuit on account of the restriction of the space on the printed circuit board on which the memory chips are mounted. Accordingly, a simple switching circuit which comprises a wiring pattern printed on the printed circuit board is used. Such a switching circuit is arranged so that for a memory chip having a defect in a particular one of four bits in one word, for example, input/output terminals associated with three non-defective bits are connected to input/output terminals of the memory module.

However, when the memory module is constructed with a plurality of memory chips in which defects occur at random positions, the use of a switching circuit which comprises such a wiring pattern can not provide a remedy since a different wiring pattern must be provided for each combination of the locations of defects in the memory chips.

For this reason, the prior art practice has been to construct a memory module using only those memory chips which have defects at an identical bit location. This enables the number of combinations of the locations of defects in the memory chips to be reduced, and hence the variety of wiring patterns can be reduced as compared with the occurrence of a random combination of defect locations.

However, to follow such scheme, the memory chips must be classified according to the location in which a defect occurred in the memory chip and the printed circuit board must be changed for each variety of the classified memory chips for manufacturing purpose, thus degrading the manufacturing efficiency.

SUMMARY OF THE INVENTION

The described problem can be solved according to present invention which provides a memory module comprising a plurality of memory chips, data input/output terminals, and switching means. One word in the memory chip comprises a plurality of bits, and each memory chip is provided with a number of input/output terminals which corresponds to the number of bits in one word. The number of data input/output terminals is less than the total number of input/output terminals of the individual memory chips. The switching means switches a connection between the input/output terminals of the respective memory chips and the data input/output terminals in a manner such that of all the input/output terminals of the individual memory chips, only those input/output terminals which are connected to non-defective bits are connected to the data input/output terminals.

BRIEF DESCRIPTION OF THE DRAWINGS

FIG. 5 is a truth table illustrating the operation of a recorder which forms a switching unit of the memory module;

FIG. 6 is a truth table illustrating the operation of a gate which forms the switching unit;

FIG. 11 is a truth table illustrating the operation of the selection circuit;

FIGS. 16A, 16B and 16C are a series of tables showing the locations of defective bits which are found by the operation check of FIG. 15;

DETAILED DESCRIPTION OF THE PREFERRED EMBODIMENTS

Figure 1:
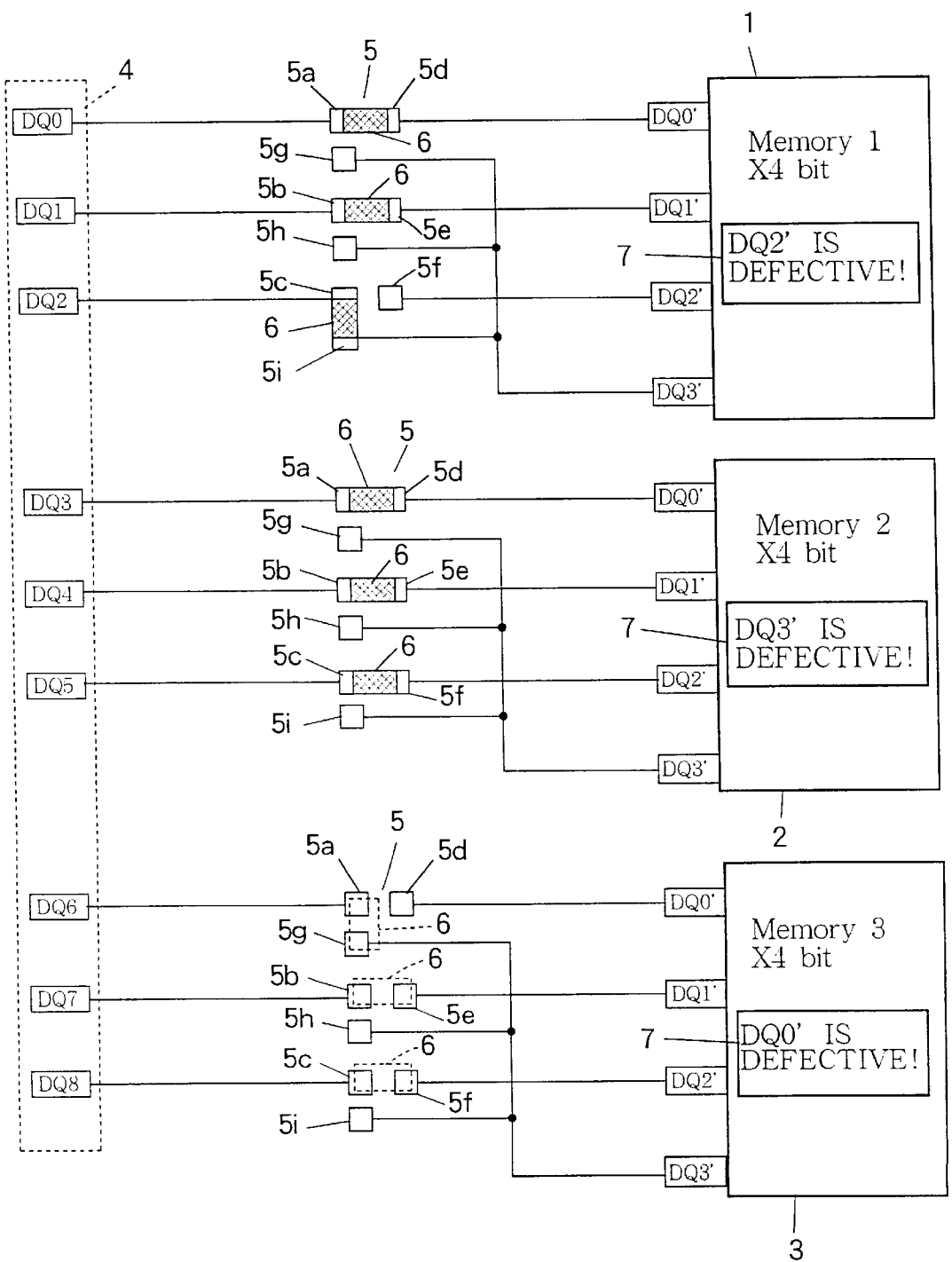
FIG. 1 is a block diagram of a pertinent part of a memory module according to a first embodiment of the present invention.

FIG. 1 is a block diagram of a memory module according to a first embodiment of the invention. A pertinent part of the memory module is shown in this Figure, and as shown, the memory module comprises memory chips 1, 2, 3, external board terminals 4 for allowing exchange of data between the memory module and an external device, a jumper chip mounted pad 5 for modifying a connection between the terminals 4 and the memory chips 1 to 3, and a jumper chip 6 which enables a switching by the pad 5.

Such a memory module comprises the memory chips 1 to 3 which are mounted on a rectangular printed circuit board which is formed on one side thereof with a card edge connector having 30 pins, for example, generally constituting a memory of 9 bits×n words (which may be 256 kilowords, 1 or 4 megawords, for example).

The external board terminals 4 includes input/output terminals corresponding to 9 pins (DQ0 to DQ8) of the 30 pins carried by the card edge connector.

In each of the memory chips 1 to 3, one word consists of four bits, and accordingly each memory chip has a storage capacity of 4 bits×n words (which may be 256 kilowords, or 1 or 4 megawords, for example).

It is assumed that each of the memory chips 1 to 3 includes an arbitrary one bit of one word (each comprising four bits) which is a defective bit, and accordingly has an indication 7 on its surface which indicates which bit is defective. It is possible to mark this indication at the time of manufacture, and erase this indication after the completion of the manufacture.

As a result of the above assumption, it follows that no defect is present except the particular one bit indicated by the indication 7 in each word in each of the memory chips 1 to 3, and thus, these memory chips can be used as a memory comprising 3 bits×n words. Accordingly, input/output terminals corresponding to three bits of the input/output terminals DQ0' to DQ3' of the memory chip 1 other than the defective bit are connected to the terminals DQ0 to DQ2 of the external board terminals 4 corresponding to three bits through the pad 5. Similarly, each of the input/output terminals corresponding to three bits of the memory chip 2 and 3 except for the defective bit are connected to the terminals DQ3 to DQ5 and DQ6 to DQ8, respectively, of the external board terminals 4 through the pad 5.

Each of the pads 5 is formed on the surface of a wiring plane of the printed circuit board, and includes selected pads 5a, 5b, 5c which are connected to terminals DQ0 to DQ2, DQ3 to DQ5 or DQ6 to DQ8 on the external board terminals 4 which corresponds to three bits, selection pads 5d, 5e, 5f disposed close to each of the selected pads 5a, 5b, 5c and connected to the input/output terminals DQ0' to DQ2' of the respective memory chips 1 to 3, and selection pads 5g, 5h, 5i disposed close to each of selected pads 5a, 5b, 5c and connected in common to the input/output terminal DQ3' of the respective memory chips 1 to 3. (It is to be noted that connection between 5d–5i and DQ0'–DQ3' is not limited that illustrated, but the selection pads 5g, 5h and 5i which are connected in common may be connected to any one of the input/output terminals DQ0' to DQ3', and 5d–5f may be connected to the remaining three input/output terminals).

A jumper chip 6 comprises a rectangular conductive member of a length which provides an electrical short-circuit selectively between the selected pads 5a to 5c and the selection pads 5d to 5f or between the selected pads 5a to 5c and the selection pads 5g to 5i. The jumper chip 6 is comparable to or smaller than a so-called chip resistor in size. When the jumper chip 6 provides a short-circuit between the selected pad 5a and the selection pad 5d on each of the pads 5, the input/output terminal DQ0' of each of the memory chips 1 to 3 is connected to the terminal DQ0, DQ3 or DQ6, respectively. Similarly, a short-circuit between the selected pad 5b and the selection pad 5e connects the input/output terminal DQ1' of each of the memory chips 1 to 3 with the terminal DQ1, DQ4 or DQ7, respectively. Similarly, a short-circuit between the selected pad 5c and the selection pad 5f connects the input/output terminal DQ2' of each of the memory chips 1 to 3 to the terminal DQ2, DQ5 or DQ8, respectively.

When the selected pad 5a and the selection 5g on the pad 5 are electrically short-circuited together, the input terminal DQ3' of each of the memory chips 1 to 3 is connected to the terminal DQ0, DQ3 or DQ6, respectively. When the selected pad 5b and the selection pad 5b are short-circuited, the input terminal DQ3' of each of the memory chips 1 to 3 is connected to the terminal DQ1 or DQ4 or DQ7, respectively. When the selected pad 5c is short-circuited to the selection pad 5i, the input terminal DQ3' of each of the memory chips 1 to 3 is connected to the terminal DQ2, DQ5 or DQ8, respectively.

The locations on the pad 5 where an electrical short-circuit is provided between the pads 5a to 5i are determined by the locations of those input/output terminals DQ0' to DQ3' which correspond to non-defective bits of the respective memory chips 1 to 3.

When a memory module as described above is manufactured, initially, a defective location on each of the memory chips 1 to 3 is detected, and the indication 7 indicating the location of the defect is given on the surface of the package of each of the chips 1 to 3. The indication 7 need not be in letters as illustrated in FIG. 1 to indicate the location of a defect, but may comprise any indication, such as a machine-readable bar code.

Next, the indication 7 on the surface of each of the memory chips 1 to 3 is then read by visual inspection or with a machine such as a bar code reader. The layout of the memory chips 1 to 3 is determined, and the layout of the jumper chips 6 on the pad 5 is determined on the basis of the indications read from the memory chips 1 to 3.

By way of example, when DQ3' is defective as shown for the memory chip 2 in FIG. 1, the jumper chips 6 are disposed between the pads 5d, 5e and 5f, which are connected to DQ0', DQ1' and DQ2', and the pads 5a, 5b, and 5c, respectively. Alternatively, when a bit corresponding to DQ2' is found defective, as shown for the memory chip 1 in FIG. 1, jumper chips 6 are disposed between pads 5a and 5d, between pads 5b and 5e, and pads 5c and 5i. In this manner, the input/output terminals DQ0', DQ1', DQ3' of the memory chip 1 are connected to the terminals DQ0, DQ1, DQ2, respectively, of the external board terminals 4. Thus, it will be seen that the memory module is arranged such that when bits corresponding to the input/output terminals DQ0' to DQ2' of the memory chip are defective, such terminal is replaced by the input/output terminal DQ3'.

Finally, when the jumper chips and the memory chips are mounted, there is formed a memory module in which one word consists of 9 bits as shown in FIG. 1.

With this memory module, by changing the location where an electrical short-circuit is provided between the pads 5a to 5i on the pad 5, depending on the location of the defective bits in each of the memory chips 1 to 3, the input/output terminals DQ0' to DQ3' of the respective memory chips 1 to 3 which are connected to the external board terminals 4 can be selected.

Since it is possible with the memory module mentioned above that the input/output terminals DQ0' to DQ3' of the memory chips which are connected to the external board terminals 4 be switched depending on the layout of the jumper chips 6 on the selection pad 5, a single kind of printed circuit board may be used independently from differing locations of defects in the memory chips 1 to 3.

Accordingly, the memory module mentioned can be constructed with memory chips which contain a defect in an arbitrary one of four bits constituting one word, and can be constructed using a single kind of printed circuit board, contributing to reducing the manufacturing cost.

While the application of the invention has been illustrated with reference to a memory module in which one word consists of 9 bits in the arrangement shown in FIG. 1, a memory module in which one word consists of 32 to 36 bits may be similarly constructed by using eleven or twelve memory chips in which one of four bits constituting one word is defective and providing jumper chip mounted pads and jumper chips in a corresponding manner.

When the indication 7 is made to be readable mechanically, the indication of the respective memory chips may be mechanically read during the manufacture, and the operation of a chip mounter which mounts the individual jumper chips may be controlled in accordance with the result read in this manner, thus the mounting of the jumper chips will be automated.

Figure 2:
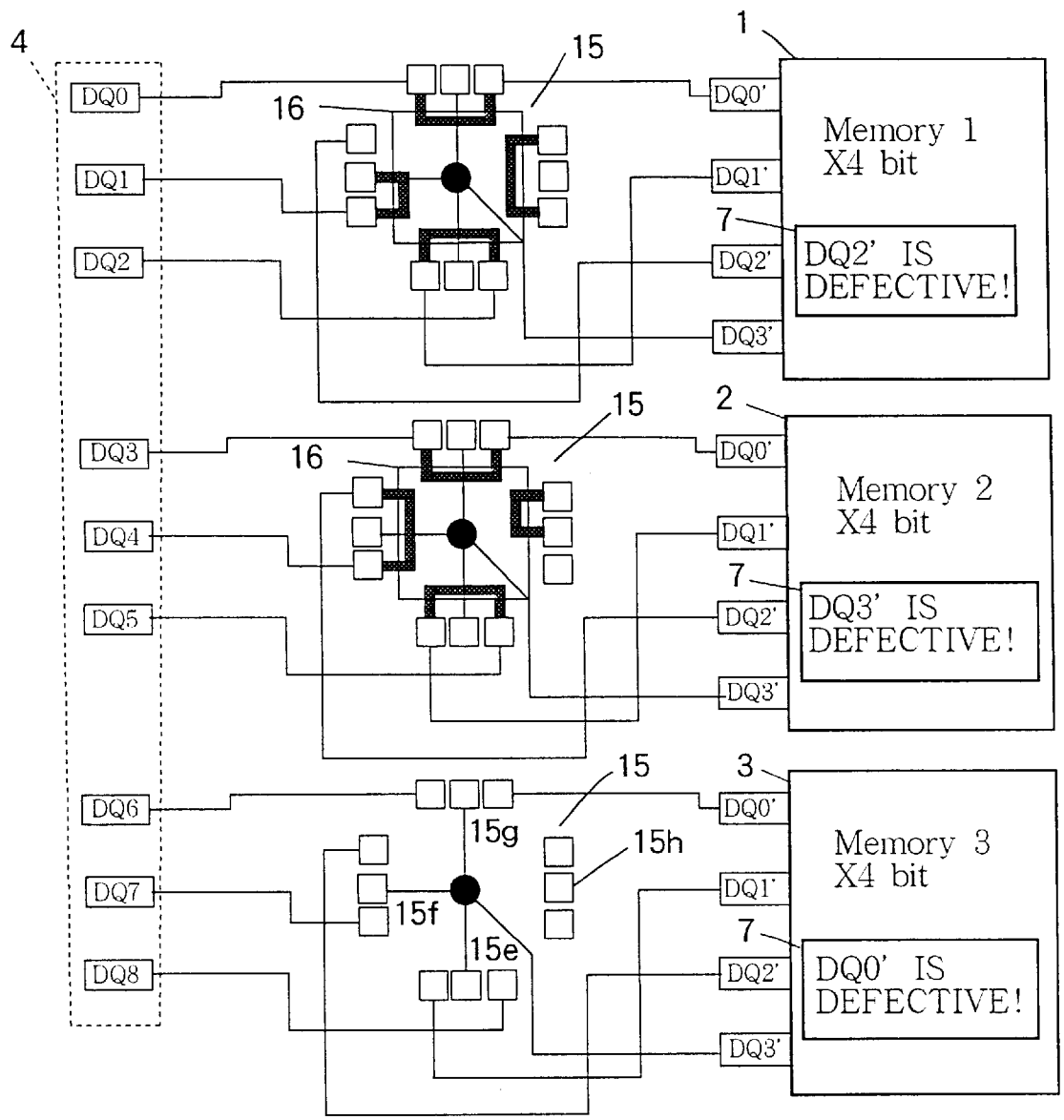
FIG. 2 is a block diagram of a pertinent part of a memory module according to a second embodiment of the present invention.

FIG. 2 is a block diagram of a memory module according to a second embodiment of the invention. A pertinent part of the memory module is shown in this Figure, and as shown, the memory module comprises memory chips 1 to 3 and an external board terminal 4 in a manner similar to that of memory module shown in FIG. 1. Each of the memory chips 1 to 3 carries an indication 7 which indicates the location of the defective bit as memory chips 1 to 3 shown in FIG. 1.

In this memory module, a collective jumper chip mounted pad 15 and a collective jumper chip 16 corresponding to the memory chips 1 to 3 are provided in place of the jumper chip mounted pads 5 and the jumper chips 6 shown in FIG. 1. The collective jumper chip mounted pad 15 includes four pad assemblies 15e, 15f, 15g and 15h which are disposed on sides of square, each assembly including three pads disposed on a line. In each of the three pad assemblies 15e, 15f, 15g, the center pad among the three pads in each assembly is connected in common to the input/output terminal DQ3' of each memory chip, and the pads disposed on the opposite sides of the center pad are connected to the external board terminals 4 and the input/output terminal DQ0', DQ1' or DQ2' of the memory chips respectively.

Figure 3:
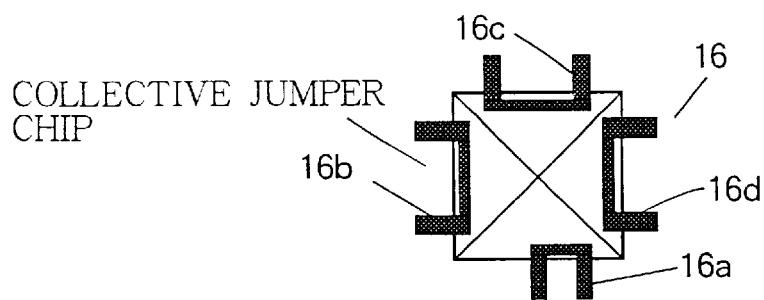
FIG. 3 is a plan view of a collective jumper chip which forms the memory module.

As shown in FIG. 3, a collective jumper chip 16 includes four jumper chips 16a, 16b, 16c, 16d which are disposed along four sides of a substantially square insulating plate member. Three jumper chips 16b to 16d of these four jumper chips comprise a substantially U-shaped conductive member of an identical configuration, arranged to provide an electrical short-circuit between pads located on the opposite ends of each pad assembly 15e to 15h. The remaining jumper chip 16a comprises a substantially U-shaped conductive member having a length of a bottom limb connecting the end limbs which is less than a corresponding length of each of the jumper chips 16b to 16d, and arranged to provide an electrical short-circuit between the center pad and a pad connected to DQ terminal in each of three pads in the pad assemblies 15e to 15h.

The collective jumper chip 16 is mounted so that the opposite ends of the individual jumper chips 16a to 16d are connected with corresponding pad assemblies 15e to 15h, respectively, and such that it may be mounted in different orientations, differing by steps of 90 degrees.

During the manufacture of such a memory module, the locations of defective bits are determined from the indications 7 on each of the memory chips 1 to 3. When a defective bit in the memory chip is one corresponding to the input/output terminal DQ3' of the memory chip, the collective jumper chip 16 is mounted in direction such that the individual jumper chips 16b, 16c, 16d are connected with the pad assemblies 15e, 15f, 15g, respectively, as shown for the collective jumper chip 16 for the memory chip 2 shown in FIG. 2. As a consequence, a short-circuit is formed between the pads located at the opposite ends of the individual pad assemblies 15e, 15f, 15g, whereby the input/output terminals DQ0' to DQ2' of the memory chip are connected to the terminals on the external board terminals 4. In this instance, the input/output terminal DQ3' of the memory chip is not connected to the external board terminals 4.

If a bit defect corresponds to one of the input/output terminals DQ0' to DQ2' of the memory chip, the collective jumper chip 16 is mounted in direction such that the jumper chip 16a is connected to one of the pad assemblies 15e to 15g which is connected to one of the input terminals DQ0' to DQ2' which corresponds to the defective bit. In this manner, the input/output terminal DQ3' is connected to the external board terminal 4 in place of one of the input terminals DQ0' to DQ2' on which a defective bit appears.

By similarly adjusting the direction of the collective jumper chip 16 with respect to the associated one of the memory chips 1 to 3 and mounting it, the input/output terminals of the respective memory chips 1 to 3 which are associated with non-defective bits are connected to terminals DQ0 to DQ8 on the external board terminals 4, thus defining a memory module shown in FIG. 2 in which one word consists of 9 bits.

With a memory chip according to the second embodiment, by changing the orientation in which the collective jumper chip 16 is mounted, the input/output terminals DQ0' to DQ3' of the memory chip which are to be connected with the external board terminals 4 can be selected in the same manner as described above in connection with the first embodiment shown in FIG. 1. Accordingly, the memory module according to the second embodiment can be constructed with memory chips in which one of four bits constituting one word is defective, in a manner similar to that of the memory module of the first embodiment.

It will be seen that the memory module according to the second embodiment has an effect similar to that of the memory module of the first embodiment, and additionally improves the manufacturing efficiency since the jumper chips corresponding to the individual memory chips are assembled into one unit.

Figure 4:
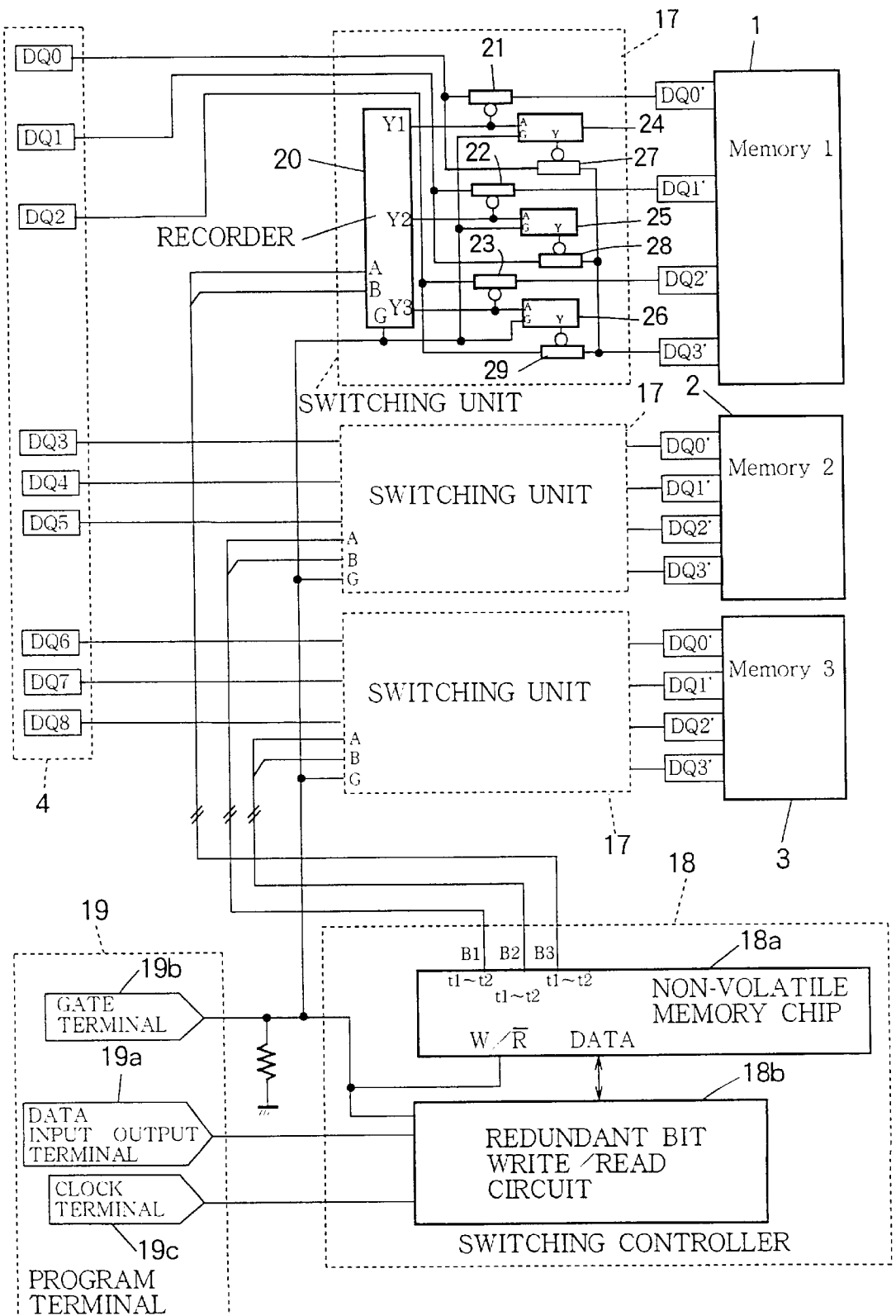
FIG. 4 is a block diagram of a pertinent part of a memory module according to a third embodiment of the present invention.

FIG. 4 is a block diagram of a memory module according to a third embodiment of the invention. A pertinent part of the memory module is shown in this Figure, and as shown, the memory module comprises memory chips 1 to 3 and an external board terminal 4, in the same manner as the memory modules shown in FIGS. 1 and 2. In the memory modules shown in FIGS. 1 and 2, the indication 7 which indicates the location of the defective bit is provided on the surface of the respective memory chips 1 to 3, but such indication is not provided on the memory module according to the third embodiment.

Specifically, the memory module comprises a switching unit 17 which is substituted for the jumper chip mounted pads 5, 15 and jumper chips 6, 16 shown in FIGS. 1 and 2, to switch a connection between the input/output terminals DQ0' to DQ3' of the memory chips 1 to 3 and the external board terminals 4, a switching controller 18 which controls a switching operation performed by the switching unit 17, and a program terminal 19 by which switching data and a gate signal are received to when a switching condition of the switching controller 18 is programmed. The program terminal 19 includes a terminal 19a by which switching data is received, a terminal 19b by which a gate signal is received, and a terminal 19c by which a clock is received.

Each of the switching units 17 comprises bidirectional buffers or semiconductor analog switch circuits 21, 22, 23 which connect input/output terminals DQ0', DQ1', DQ2' of respective memory chips to corresponding terminals on the external board terminal 4, bidirectional buffers 27, 28, 29 which connect input/output terminals DQ3' of respective memory chips to corresponding terminals on the external board terminal 4, gates 24, 25, 26 for controlling the operation of the bidirectional buffers 21 to 23 and 27 to 29, and a recorder or logic circuit 20 which controls a switching operation performed by the gates 24 to 26 in accordance with a command from the switching controller 18.

Each recorder 20 comprises a two-bit recorder or selector, and delivers selection outputs Y1, Y2, Y3 on the basis of a switching command (A, B) and a gate signal (G) from the switching controller 18 as indicated by a truth table shown in FIG. 5. Each of the gates 24, 25, 26 controls the operation of bidirectional buffers 21 to 23 and 27 to 29 on the basis of selection outputs Y1, Y2, Y3 from the recorder 20, supplied thereto as input A, and a gate signal (G) in a manner indicated by a truth table of FIG. 6.

The switching controller 18 includes a non-volatile memory chip 18a such as EEPROM (Electrically Erasable Programmable ROM) which is electrically rewritable. The memory chip 18a assumes a data write mode when a high level signal is supplied from the program terminal 19b, and assumes a data read mode when a low level signal is supplied. It has a storage capacity of six bits, and two bits each of the output which are read from the stored six bits are supplied to the recorder 20 of each switching unit 17 as a switching command.

In distinction from the memory modules according to the first and the second embodiment described above, the memory module of the third embodiment does not require a switching step during assembly, but is mounted on a memory module inspecting/programming device (hereafter simply referred to as inspection unit) after completion of the assembly, to be programmed for the purpose of switching operation.

The inspection unit is capable of writing into, reading from or programming the memory module through the external board terminal 4 and the programming terminal 19 shown in FIG. 4.

Figure 7:
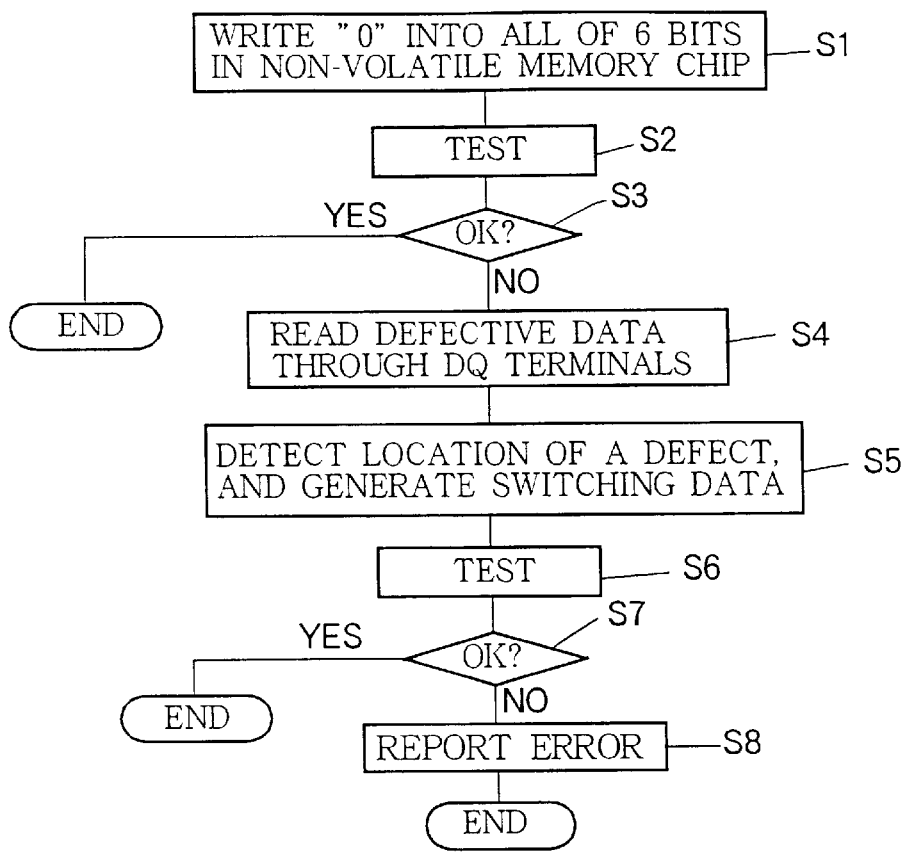
FIG. 7 is a flow chart of a programming procedure for a switching controller of the memory module.

When the memory module is connected to such an inspection unit, and programming is instructed, the operation proceeds to step S1 in a flow chart shown in FIG. 7 where "0" is entered into all of six bits in the non-volatile memory chip 18a, whereupon the operation proceeds to step S2. Specifically, data supplied to the terminal 19a is made to "0" (low level), and a gate signal supplied to the terminal 19b is changed to its high level for a given time interval. Since the gate signal is supplied to the memory chip 18a as a selection signal between a data supply and read-out, when the gate signal assumes a high level, the memory chip 18a responds to a clock signal supplied from the terminal 19c to store data supplied through the terminal 19a.

When "0" is entered in all of the six bits in the memory chip 18a and the gate signal returns to its low level, the data stored in the memory chip 18a is read out to be delivered as an output. In this instance, because the output which is read from the memory chip comprises all "0"'s, bits of the switching command A, B which are supplied to each of the recorders 20 are both "0", and outputs Y1, Y2, Y3 from the recorder 20 will be all "0"'s (low level) as shown in FIG. 5, whereby the bidirectional buffers 21 to 23 function as buffers, and the bidirectional buffers 27 to 29 do not function as buffers. Accordingly, the input/output terminals DQ0' to DQ2' of memory chips 1 to 3 are connected to the external board terminal 4.

At step S2, the inspection unit performs a data write/read test over the entire storage area of the memory module, and determines the presence or absence of any defect over the entire storage area at step S3. If no defect is found, the test is completed. When a defect is found, the operation proceeds to step S4.

At step S4, the inspection unit reads data stored in a memory module through the external board terminal 4. At subsequent step S5, the inspection unit detects the location of a defect, namely, which bit in any one of the memory chips 1 to 3 is defective, and generates switching data consisting of six bits, on the basis of the location of the detected defect, and supplies switching data to the memory chip 18a through the terminal 19a. Then the operation proceeds to step S5.

Specifically, the switching data stored in the memory chip 18a is arranged such that the two most significant bits, the next two most significant bits and the two least significant bits correspond to the memory chips 1, 2 and 3, respectively. Each pair of two bits are supplied to the recorder 20 of the associated switching circuit 17 as the switching command A, B, and thus represent a switching condition achieved by the respective switching units 17. More specifically, when the two bits in the pair are equal to "00", the corresponding outputs Y1, Y2, Y3 from the recorder 20 are all at their low level, whereby the corresponding input/output terminals DQ0' to DQ2' of the associated memory chip are connected to the external board terminals 4. When the two bits in the pair are equal to "01", only the output Y1 from the recorder 20 assumes 1 (high level), as shown in FIG. 5, whereby the corresponding bidirectional buffer 27 functions as a buffer while the corresponding bidirectional buffer 21 does not function as a buffer, thus causing the corresponding input/output terminal DQ0' of the associated memory chip to be replaced by the input/output terminal DQ3'. Similarly, when the two bits in the pair are equal to "10" or "11", only the output Y2 or Y3 of the recorder 20 assumes a high level, as shown in FIG. 5, whereby the corresponding bidirectional buffer 28 or 29 functions as a buffer while the corresponding bidirectional buffer 22 or 23 does not function as a buffer, causing the input/output terminals DQ1' or DQ2' of the associated memory chip to be replaced by the input/output terminal DQ3'.

In this manner, by generating switching data on the basis of the location of a defect detected by the inspection unit and writing such data into the memory chip 18a, the input/output terminals DQ0' to DQ3' of the associated memory chip which are specified by the switching data are connected to the external board terminal 4.

In addition, the inspection unit performs a data write/read test over the entire storage area of the memory module again at step S6, and determines the presence or absence of any defect over the entire storage area at step S7. If no defect is found, the operation ends. However, when a defect is found, the defect is regarded as non-correctable, the occurrence of an error is reported at step S8, and then the operation ends. When the occurrence of an error is reported at step S7, it is considered that some one memory chip contains two or more bit defects, so the memory module is discarded. Only those memory modules for which no error has been detected at steps S3 and S7 are accepted as non-defective products.

Figure 8:
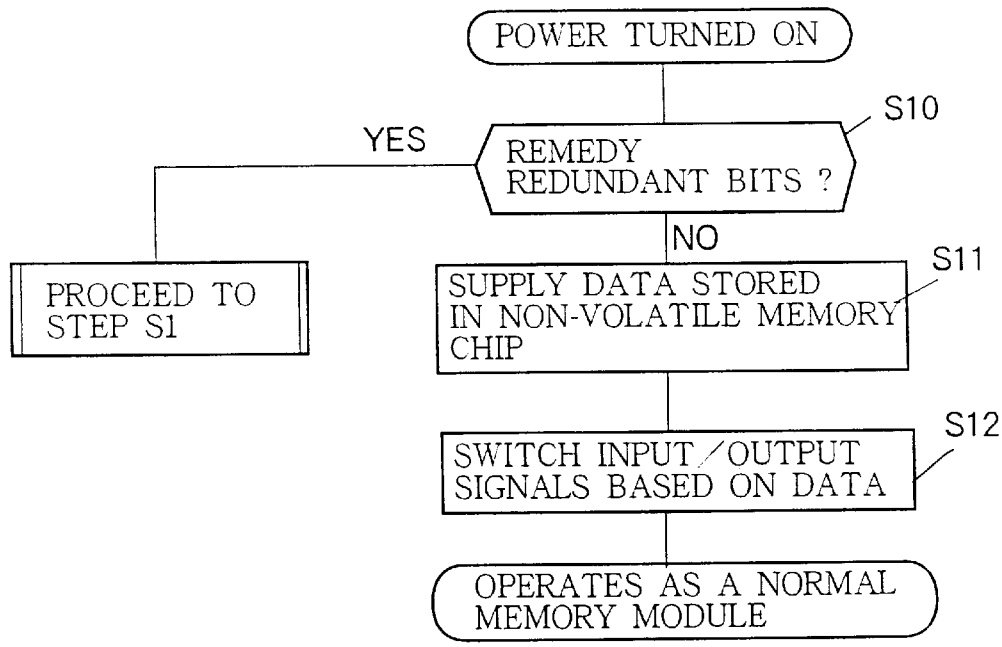
FIG. 8 is a flow chart illustrating the operation of the switching controller of the memory module.

The memory module which is formed in this manner operates according to the flow chart shown in FIG. 8 during a normal operation. Specifically, when the power is turned on, the switching controller 18 determines at step S10, whether a high level voltage is supplied to the terminal 19b. When the answer is in the affirmative, the gate signal assumes a high level, and accordingly the operation proceeds to step S1 in the flow chart shown in FIG. 7. However, when the answer is in the negative, six bit data stored in the memory chip 18a is read out at step S11, supplying each two bit pair to the recorder 20 of the respective switching unit. The input/output terminals DQ0' to DQ3' of the associated one of the memory chips 1 to 3 are switched on the basis of the two bit data supplied to the corresponding recorder 20. In this manner, the memory module subsequently operates in a manner similar to that of a normal memory module, as viewed from an information processing system which utilizes such memory modules.

In addition to the effects brought forth by the first embodiment, the memory module according to the third embodiment can prevent a faulty product from being produced as a result of an inadvertent mounting of parts such as jumper chips since it is provided with the switching unit 17 and the associated switching controller 18 which are capable of electrically controlling the switched condition from an external device. In addition, the memory module of the third embodiment allows the switched condition to be established subsequent to the manufacture of the memory module. This permits any bit defect in the memory chip which occurs subsequent to the manufacture to be corrected. Thus, the yield of the memory module can be further improved. Since there is no need to provide an indication, as mentioned before, on each memory chip in the present memory module, the need for a step to the remove such indication is eliminated.

The provision of the switching unit 17 and the associated switching controller 18, which enable electrical control of the switched condition, allow an accommodation such that in the event a particular bit becomes defective during use of the memory module, for example, the defective bit can be replaced by a redundant bit, if there is an unused redundant bit. By providing the function of switching a redundant bit in substitution for the defective bit on a personal computer, work station or the like, the reliability of the memory of such machine can be improved. In the arrangement shown in FIG. 4, the invention has been applied to a memory module in which one word consists of nine bits. However, by using twelve memory chips in which each memory chip contains a defect in one of four bits constituting one word, for example, and by increasing the number of the memory chips 18a and the switching units 17 in a manner corresponding to the number of memory chips, the memory modules in which one word consists of 32 to 36 bits can also be constructed.

Figure 9:
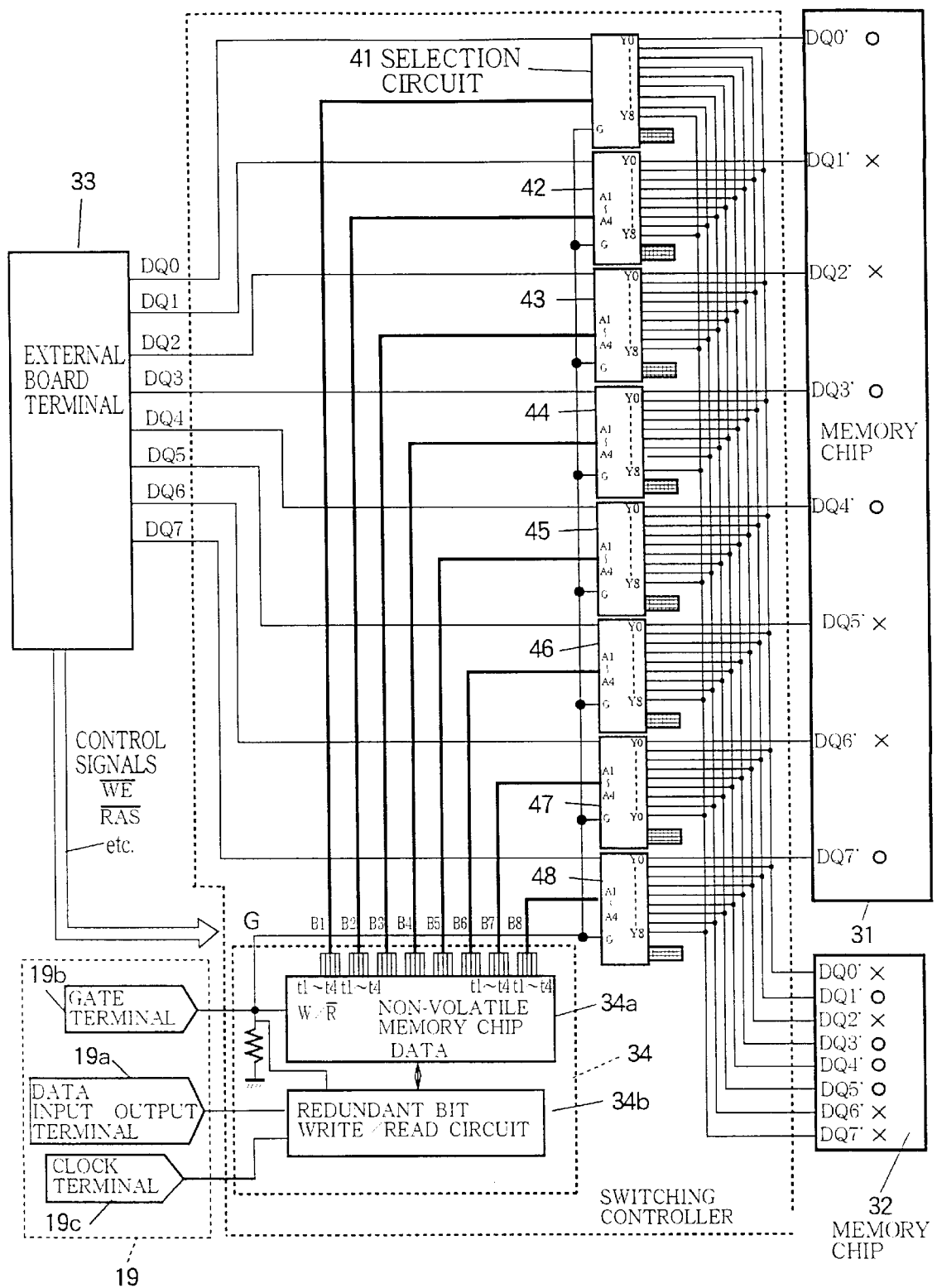
FIG. 9 is a block diagram of a pertinent part of a memory module according to a fourth embodiment of the present invention.

FIG. 9 is a block diagram of a pertinent part of a memory module according to a fourth embodiment of the invention. In distinction from the first through the third embodiments, the memory module of the present embodiment is capable of replacing the defective bits by redundant bits when a single memory chip contains a plurality of defects.

As shown in FIG. 9, the memory module comprises a pair of memory chips 31, 32, an external board terminal 33 which enables an exchange of data between the memory module and an external device, eight selection circuits 41 to 48 for changing the connections between the external board terminal 33 and the memory chips 31, 32, a switching controller 34 for controlling selections made by the respective selection circuits 41 to 48, and a program terminal 19 to which control signals and program data are supplied to establish conditions for switching made by the switching controller 34.

Each of the memory chips 31, 32 comprises a memory chip having a capacity of 8 bits×n words (such as I megawords, for example) in which one word consists of 8 bits. It is assumed that each word contains defects in not more than four bits. However, it is to be understood that the number of defective bits in each of the memory chips 31, 32 may be arbitrary, provided the total number of bits which operate normally over the pair of memory chips 31, 32 is equal to or greater than 8. Accordingly, a combination in which the memory chip 31 contains defects in every bit while the memory chip 32 contains all the bits which operate normally is also acceptable.

Each of the selection circuits 41 to 48 is connected with a corresponding input/output terminal DQ0' to DQ7' of the memory chip 31, and all the input/output terminals DQ0' to DQ7' of the memory chip 32 are connected in common to all of the selection circuits 41 to 48. Selection circuits 41 to 48 are supplied with respective four-bit selection signals B1 to B8 from the switching controller 34, the four bits of each selection signal being denoted t1 to t4. A gate signal G is supplied in common to all of the selection circuits 41 to 48. These selection circuits 41 to 48 operate to switch connections between the input/output terminals DQ0' to DQ7' of the memory chips 31, 32 and the terminals DQ0 to DQ7 of the external board terminal 33 in accordance with the selection signals t1 to t4 and the gate signal G from the switching controller 34.

Figure 10:
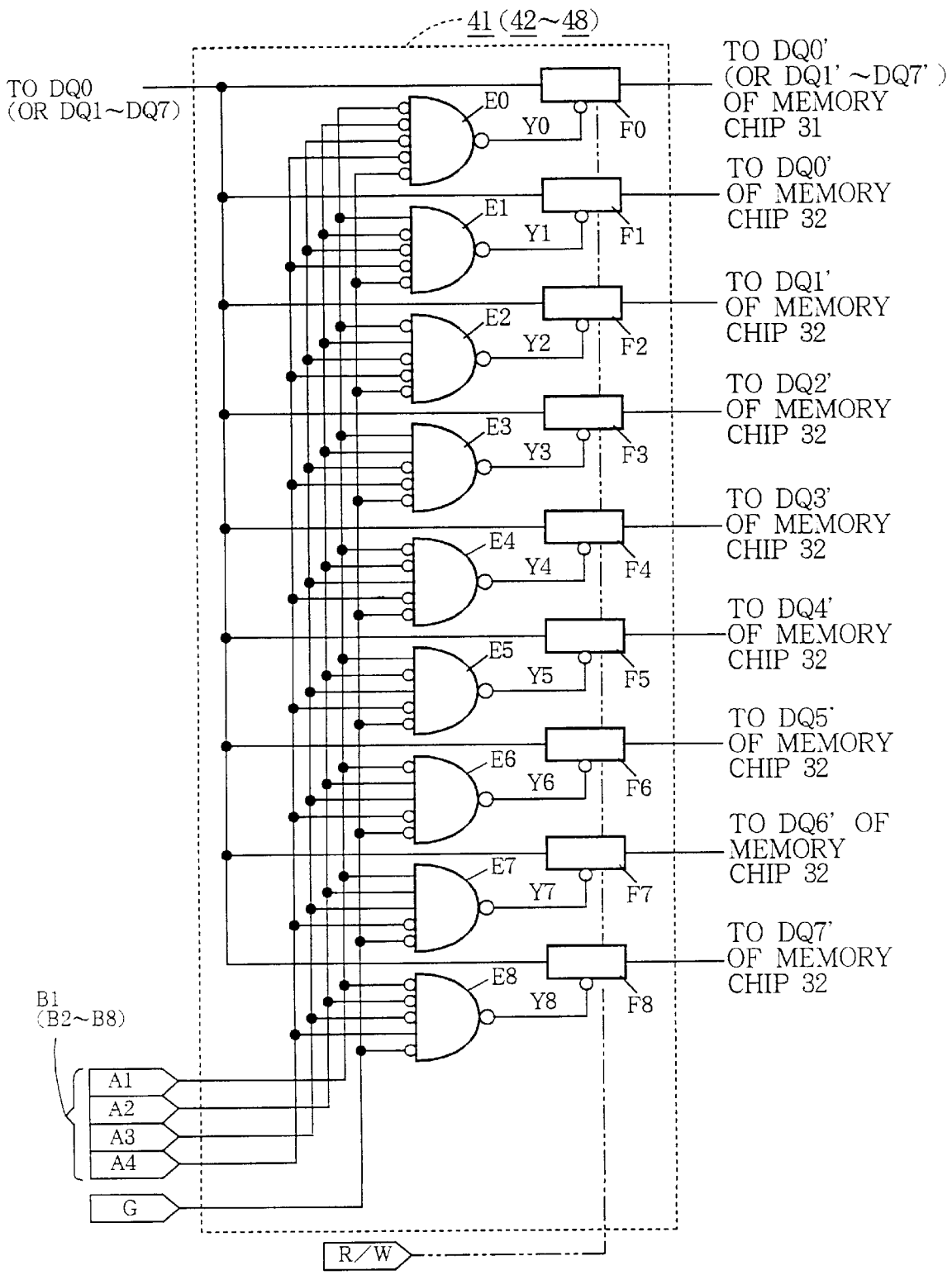
FIG. 10 is a circuit diagram of a selection circuit which forms the memory module.

Each of the selection circuits 41 to 48 may comprise a logic circuit shown in FIG. 10. Specifically, the selection circuit comprises gates E0 to E8 which decode signals t1 to t4 of the selection signal outputs B1 to B8 received from the switching controller 34 and received through the input terminals A1 to A4, and the gate signal G received through the input terminals G, and bidirectional buffers or semiconductor analog switch circuits F0 to F8 which are controlled by outputs Y0 to Y8 from the gates E0 to E8. In the description to follow, the arrangement of the selection circuit 41 will be described as a representative example.

The buffer F0 of the selection circuit 41 has its one of its input/output terminals connected to the input/output terminal DQ0' of the memory chip 31, and similarly the buffers F1 to F8 have one input/output terminal connected to a corresponding one of input/output terminals DQ0' to DQ7' of the memory chip 32. The other input/output terminals of the buffers F0 to F8 are connected in common to the terminal DQ0 of the external board terminal 33 of the memory module. Each of the bidirectional buffers F0 to F8 has a control input, to which a corresponding one of outputs Y0 to Y8 from the gates E0 to E8 is supplied. When the outputs Y0 to Y8 assume a low level, a connection is established between the opposite input/output terminals of the buffer.

Referring to the truth table shown in FIG. 11, which illustrates the operation of the selection circuits, the outputs Y0 to Y8 from the gates E0 to E8 are such that when the value n which represents a decimal number converted from the data supplied to the input terminals A1 to A4 (representing a value n=A4×8+A3×4+A2×2+A1 where A1 to A4 represent data supplied to the respective input terminals A1 to A4) is equal to 0, 1, 2, . . . 8, only a corresponding one of the outputs Y0, Y1, Y2, . . . Y8 can assume a low level. When the gate signal G assumes a high level, the outputs Y0 to Y8 from the gates E0 to E8 all assume a high level, and accordingly, none of the input/output terminals of the memory chips 31, 32 is connected to the terminal DQ0 of the external board terminal 33.

When data n supplied to the input terminals A1 to A4 is equal to 0, only the buffer F0 is in connection state, whereby the input/output terminal DQ0' of the memory chip 31 is connected to the terminal DQ0 of the external board terminal 33. When data n assumes a value equal to 1 to 8, only one of the buffers F1 to F8 is in connection state, and one of the input/output terminals DQ0' to DQ7' of the memory chip 32 is connected to the terminal DQ0. In this manner, the selection circuit 41 enables the input/output terminal DQ0' of the memory chip 31 to be replaced by one of the input/output terminals DQ0' to DQ7' of the memory chip 32 which is specified by decode signals t1 to t4 of the selection signal output B1.

The operation of the selection circuits 42 to 48 are essentially the same as the selection circuit 41 except that the selection signal output supplied from the switching controller 34 is replaced with one of the selection signal outputs B2 to B8, and that the terminal connected to the bidirectional buffer F0 is changed from the terminal DQ0 to one of the terminals DQ1 to DQ7 of the external board terminal 33, and the terminal connected to the bidirectional buffer F0 is changed from the input/output terminal DQ0' to one of the terminals DQ1' to DQ7' of the memory chip 31. Accordingly, these selection circuits 42 to 48 also enable one of the input/output terminals DQ1' to DQ7' of the memory chip 31 to be replaced by one of the input/output terminals DQ0' to DQ7' of the memory chip 32, which is specified by a corresponding one of the selection signals from the outputs B2 to B8.

Referring to FIG. 9, the switching controller 34 comprises a non-volatile memory chip 34*a* which stores a switching condition made by each of the selection circuits, and a redundant bit write/read circuit 34*b* which controls a write/read operation to the non-volatile memory chip 34*a*. More specifically, as shown in FIG. 12, the non-volatile memory chip 34*a* includes eight non-volatile memory chips 51 to 58, and the redundant bit write/read circuit 34*b* comprises bidirectional buffers 61 to 68 corresponding to each of the non-volatile memory chips 51–58, and a shift register 69.

Figure 12:
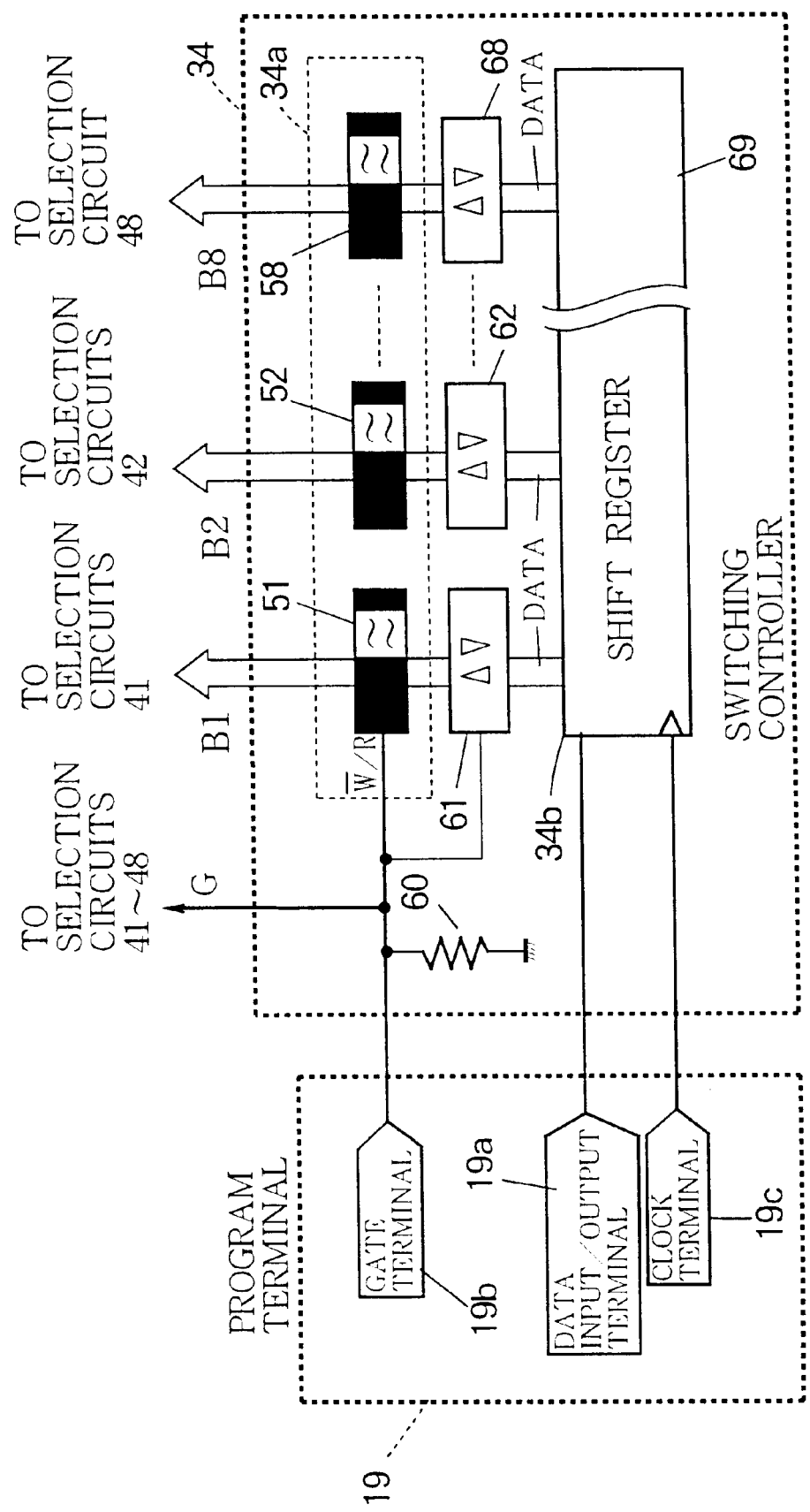
FIG. 12 is a block diagram of a switching controller which forms the memory module.
Figure 13:
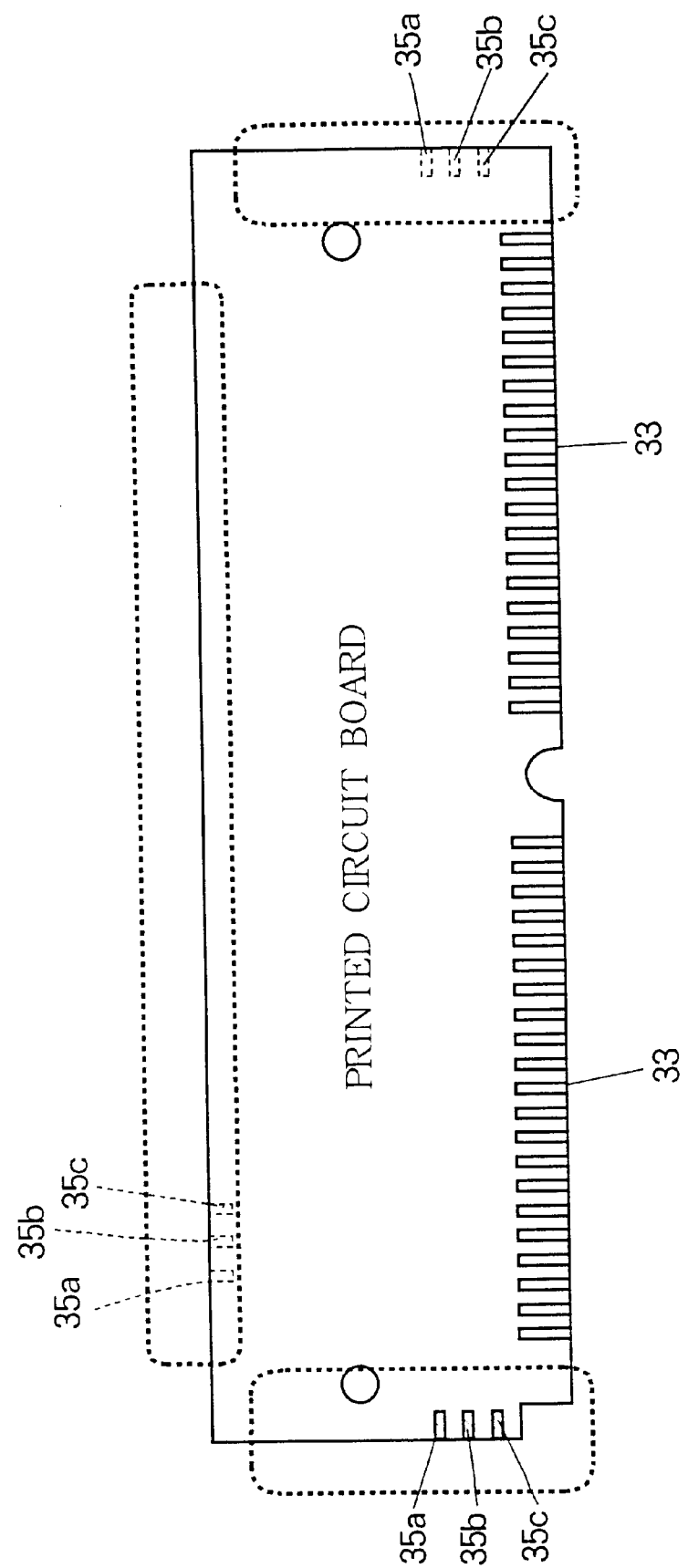
FIG. 13 is a schematic view of a program devoted control terminal which forms the memory module.

Also as shown in FIG. 12, the program terminal 19 comprises a gate terminal 19*b* to which the gate signal G is supplied, a serial data input/output terminal 19*a* which permits a data access to the shift register 69, and a clock terminal 19*c* to which a write/read clock to the shift register 69 is supplied. These terminals 19*a* to 19*c* can be formed on a part of the periphery of the printed circuit board where the external board terminal 33 is not formed, as shown in a block indicated by broken lines in FIG. 13.

Figure 14A:
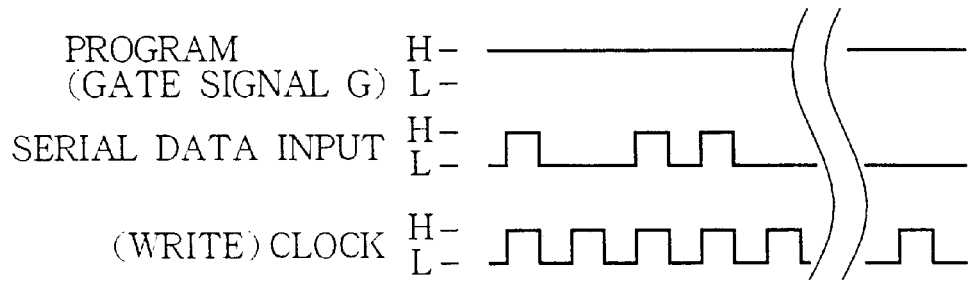
FIGS. 14A, 14B and 14C are a series of waveform diagrams illustrating the operation of a redundant bit write/read circuit which forms the switching controller.

When data for commanding a switching to redundant bit is to be written into the non-volatile memory chips 51 to 58 in the switching controller 34, a write clock is supplied to the clock terminal 19*c* under the condition that a high level voltage is applied to the program terminal 19*b*, and serial data is supplied to the serial data input/output terminal 19*a* in synchronism with the write clock, as shown in FIG. 14A. This causes the shift register 69 to shift the serial data in response to the write clock, and the shifted data is provided to each of the non-volatile memory chips 51 to 58 through the buffers 61 to 68, respectively.

Figure 14B:
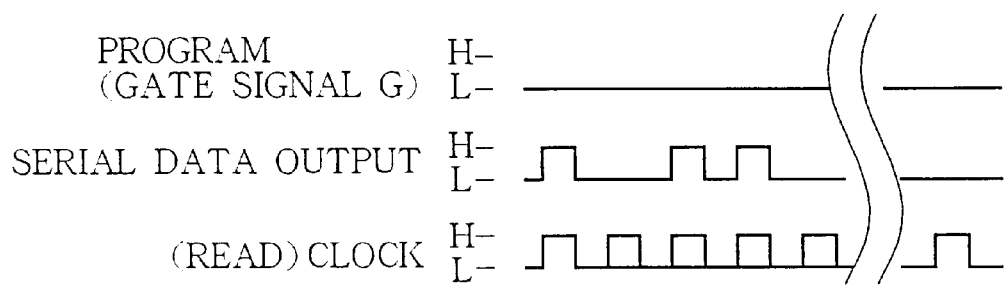

When data is to be read from the non-volatile memory chips 51 to 58, a read clock is supplied to the clock terminal 19*c* under the condition that a low level voltage is applied to the program terminal 19*b* as shown in FIG. 14B. This allows the data stored in the individual non-volatile memory chips 51 to 58 to be provided to the shift register 69 through the bidirectional buffers 61 to 68, respectively, whereby the data is shifted in synchronism with the read clock to be delivered to the serial data input/output terminal 19*a*.

Figure 14C:
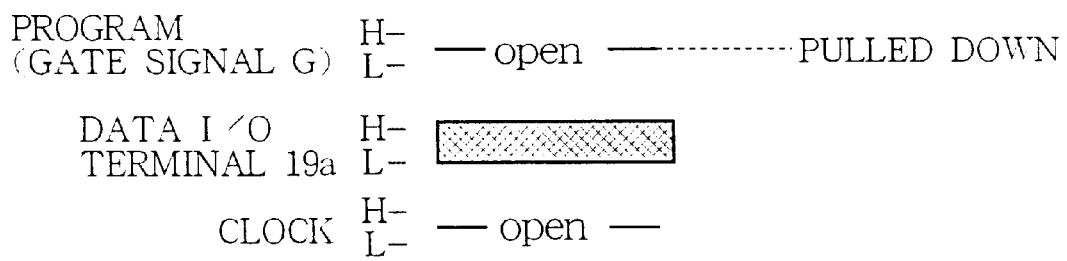

During use as a normal memory module, no connection is made to the program terminal 19*b* and the clock terminal 19*c*. Accordingly, the gate signal G is brought to its low level by the pull-down resistor 60, and no writing is made to the individual non-volatile memory chips 51 to 58, as shown in FIG. 14C. While the data stored in the non-volatile memory chips 51 to 58 is provided to the shift register 69 through the bidirectional buffers 61 to 68, a transfer or shift operation by the shift register 69 does not take place since no read clock is supplied. Hence, what occurs is only that either a high level or a low level signal is delivered from the serial data input/output terminal 19*a*.

During the manufacture of the memory module constructed in the manner mentioned above, each of the non-volatile memory chips 51 to 58 is set to 0 as an initial value. Under this condition, the individual selection circuits 41 to 48 shown in FIG. 9 connect the input/output terminals DQ0' to DQ7' of the memory chip 31 to the terminals DQ0 to DQ7 of the external board terminal 33, respectively.

Upon completion of the manufacture of the memory module, the memory module is connected to an inspection unit similar to an inspecting/programming device as used in the third embodiment and a programming operation takes place through the external board terminal 33 and the programming devoted control terminal 19. During the programming operation, an operation check of the respective memory chips 31, 32 is made to detect the location of a defective bit or bits, and switching to be made by the individual selection circuits 41 to 48 is established on the basis of the locations of such defective bits detected so that they may be replaced by redundant bits.

Figure 15:
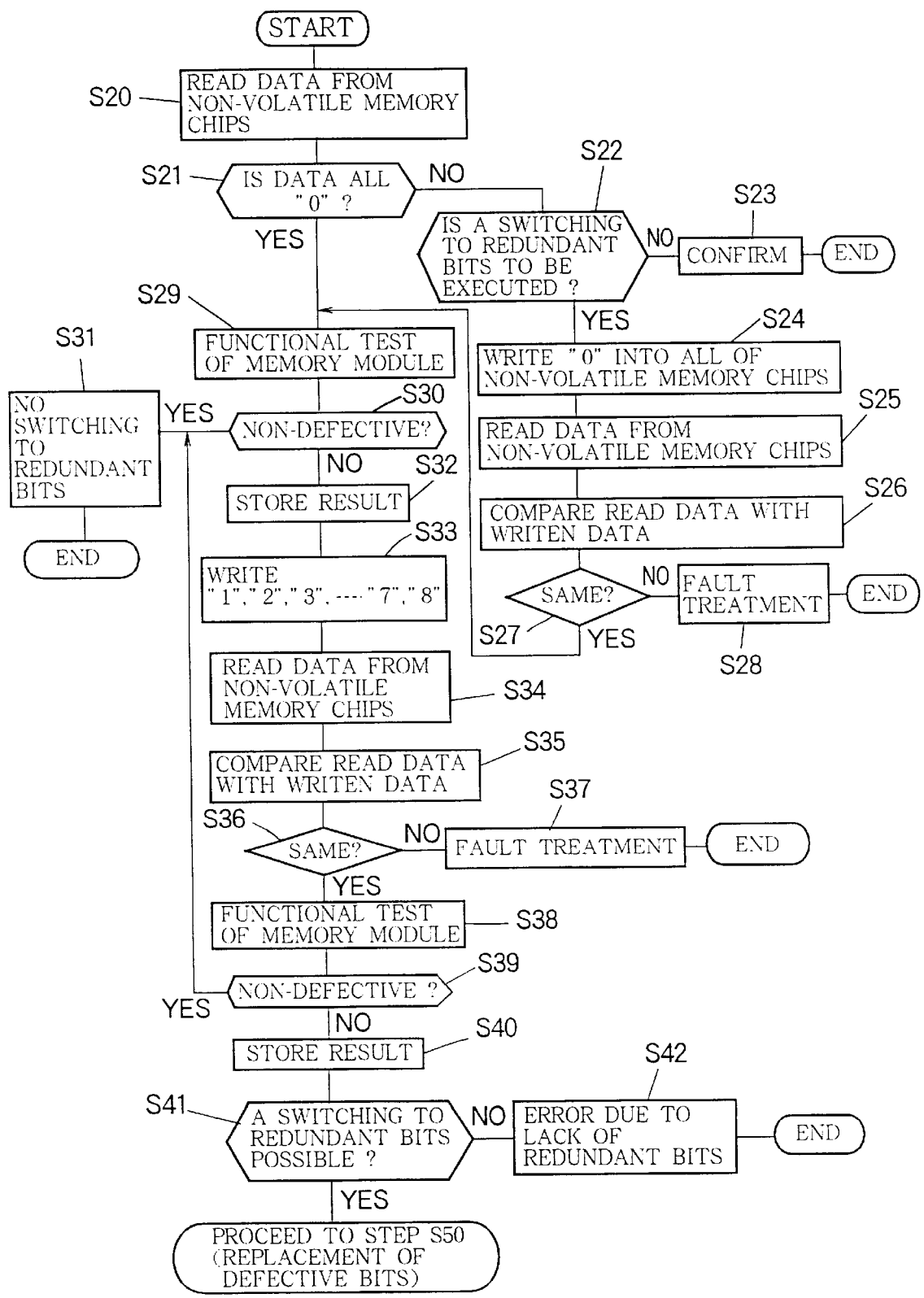
FIG. 15 is a flow chart illustrating a checking of the operation of individual memory chips which form the memory module.

The operation check of each of the memory chips 31, 32 takes place according to a flow chart shown in FIG. 15. Specifically, when a check of each of the memory chips 31, 32 is commanded, the inspection unit proceeds to step S20 shown in FIG. 15, where a read clock is supplied to the shift register 69 through the clock terminal 19c shown in FIG. 12, and data which is read out from the individual non-volatile memory chips 51–58 and derived at the serial data input/output terminal 19a through the individual buffers 61 to 68 and the shift register 69 are received. The operation then proceeds to step S21.

At step S21, the inspection unit determines whether the derived data are all "0" or not. If the answer is in the affirmative (YES), the operation proceeds to step S29. However, when the answer is in the negative (NO), since there is possibility that this memory module may have been previously undergone a programming operation, the operation proceeds to step S22 to confirm whether switching to a redundant bit is or is not to be executed depending on a command from a user. When switching is not to be executed, confirmation is made at step S23, whereupon the operation ends. When a switching is to be executed, the operation proceeds to step S24. At step S24, the inspection unit supplies write clock to the shift register 69 through the clock terminal 19c shown in FIG. 12, and also supplies "0" for 32 bits (4 bits×8 registers) to the serial data input/output terminal 19a in synchronism with the clock, in a manner illustrated in FIG. 14A, and then the operation proceeds to step S25. In this manner, "0" is written into all of the non-volatile memory chips 51 to 58 through the shift register 69 and the respective buffers 61 to 68.

At step S25, the inspection unit reads data from the non-volatile memory chips 51 to 58, in a manner similar to that at step S20, and compares, at step S26, the read data with "0" for the 32 bits which were written at step S24. A result of the comparison is determined at step S27. If they match, the operation proceeds to step S29. When they do not match, this means that the non-volatile memory chips 51 to 58, the buffers 61 to 68, or the shift register 69 of the switching controller 34 are faulty in operation, and accordingly, a faulty treatment, such as an indication to this effect, is made at step S28, and then the operation ends.

At step S29, the inspection unit performs a functional test of the memory chip 31, detecting any defective bit or bits. The operation subsequently proceeds to step S30. As mentioned previously, when "0" is written into all of the non-volatile memory chips 51 to 58, the input/output terminals DQ0' to DQ7' of the memory chip 31 are connected to the terminals DQ0 to DQ7 of the external board terminal 33. Hence, by performing a write/read operation with respect to the memory module through the external board terminal 33, followed by a comparison of written data and read data, a functional test of the memory chip 31 can be achieved.

At step S30, the inspection unit determines whether or not the memory chip 31 is non-defective, or if there is no defect in any bit therein. If it is found that the memory chip is non-faulty, there is no need to perform a switch to a redundant bit or bits, and accordingly, an indication to this effect is made at step S31, whereupon the operation ends. However, when the memory chip 31 is found faulty, the operation proceeds to step S32.

At step S32, the inspection unit stores the location (or locations) of a defective bit (or bits) in the memory chip 31 which is detected during the functional test at step S29, as a first defective location table (Table 1), as shown in FIG. 16A, and then proceeds to step S33.

At step S33, the inspection unit brings the gate signal G to its high level, supplies a write clock to the clock terminal 19c, and supplies data, which is binary coded versions of "8", "7", "6", "5", "4", "3", "2", and "1", to the serial input/output terminal 19a in synchronism with the write clock, whereupon it proceeds to step S34. The data supplied to the serial input/output terminal 19a is sequentially shifted through the shift register 69 in synchronism with the clock, and then fed to the individual non-volatile memory chips 51 to 58 through the respective buffers 61 to 68. In this manner, data representing binary coded versions of "1", "2", . . . "7", and "8" is written into the non-volatile memory chips 51 to 58, respectively. In response thereto, the individual selection circuits 41 to 48 connect the input/output terminals DQ0' to DQ7' of the memory chip 32 to the terminals DQ0 to DQ7 of the external board terminal 33, respectively.

In the portion of the flow chart including steps S34 to S37, the inspection unit reads data from the individual non-volatile memory chips 51 to 58, and compares the read data with the written data. If the read data does not coincide with the written data, indicating that one of the non-volatile memory chips 51 to 58, the buffers 61 to 68, or the shift register 69 of the switching controller 34 is malfunctioning, the inspection unit takes action such as providing an indication to this effect at step S37, in a manner similar to that at steps S25 to S28. The operation then ends. When the read data coincide with the written data, the operation proceeds to step S38.

At step S38, the inspection unit performs a functional test of the memory chip 32 to detect any defective bit or bits. It then proceeds to step S39, where if no defect is found in any bit of the memory chip 32, meaning that the input/output terminals DQ0' to DQ7' of the memory chip 32 can be directly connected to the terminals DQ0 to DQ7 of the external board terminal 33, it proceeds to step S31 where a treatment such as providing an indication to the effect that switching to a redundant bit or bits is unnecessary is made, whereupon the operation ends. If the memory chip 32 is found faulty, the operation proceeds to step S40, where the location (or locations) of the defective bit (or bits) in the memory chip 32 which is detected during the functional test at step S38 is stored as a second defective location table (Table 2), as shown in FIG. 16B, and subsequently proceeds to step S41.

Figure 17:
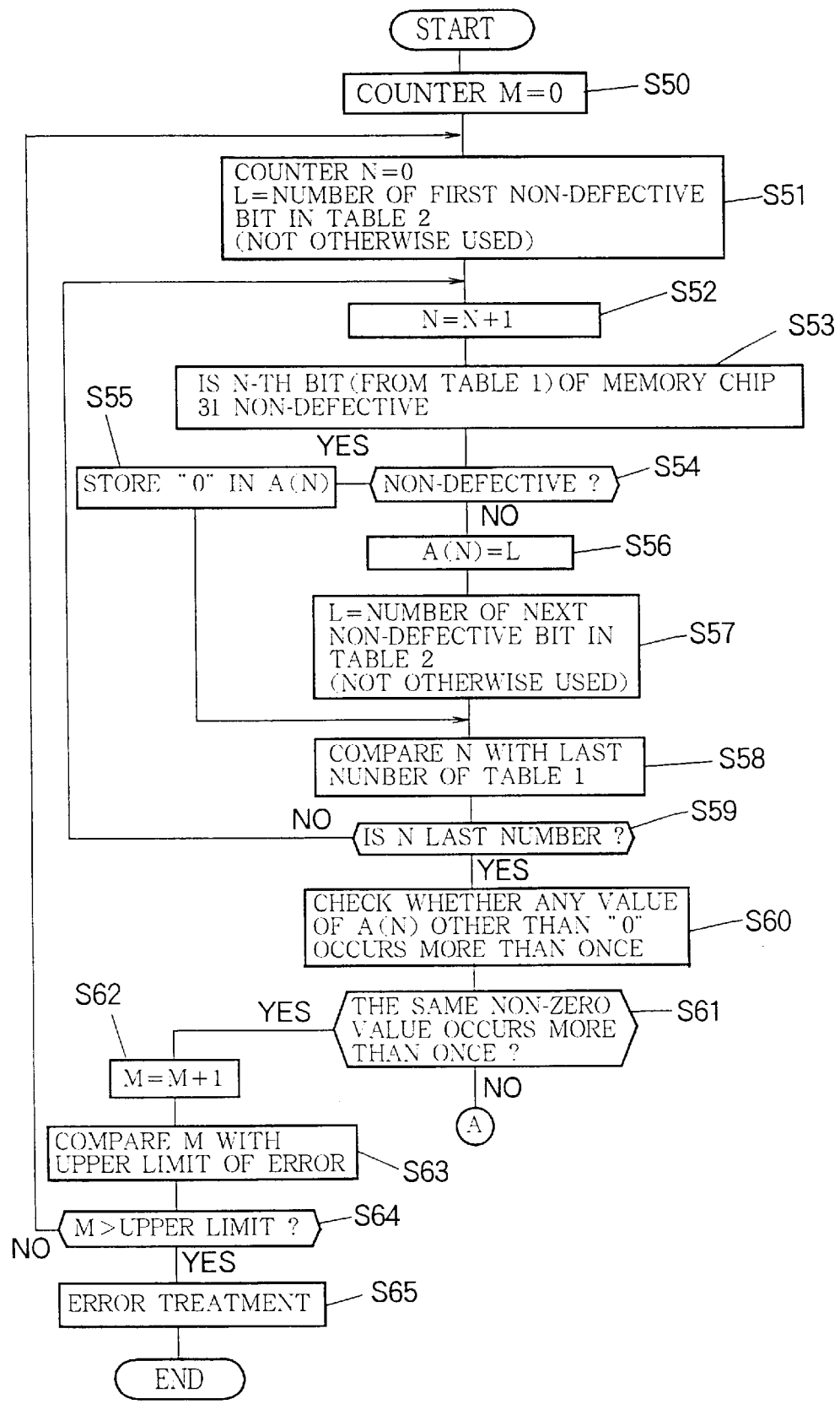
FIG. 17 is a flow chart of a replacement of defective bits in the memory module by redundant bits.

At step S41, the inspection unit refers to Table 1, and Table 2 determines if there exist 8 or more non-defective bits in total in the combination of the memory chips 31 and 32, or if a memory module in which one word consists of 8 bits can be constructed by switching to redundant bits. If the answer is in the negative, the inspection unit performs an error treatment, such as an indication to the effect that the resulting memory module is faulty at step S42. If the answer is in the affirmative, the operation proceeds to step S50 in the flow chart shown in FIG. 17, thus beginning a replacement of the defective bits by the redundant bits.

At step S50, the inspection unit resets a counter M, and resets a counter N at subsequent step S51 where an index L is set to a number corresponding to the first non-defective bit in Table 2, which is "2" in the example shown in FIG. 16B, and subsequently proceeds to step S52.

At step S52, the inspection unit adds "1" to the count in the counter N. At the following step S53, the inspection unit refers to Table 1 shown in FIG. 16A and determines if the N-th bit in the memory chip 31 is or is not non-defective. At step S54, the inspection unit renders a decision on the basis of a result of the determination. When the N-th bit is non-defective, the operation proceeds from step S54 to the next step S55 where "0" is stored in Table 3, as shown in FIG. 16C, at a location A (N). Then the operation proceeds to step S58. If the N-th bit is defective, the operation proceeds to step S56 where the content of the index L is stored at A (N) and at next step S57, the value of the index L is updated to a number which corresponds to the next non-defective bit in the memory chip 32 from Table 2, and subsequently proceeds to step S58. For example, when N=1, the N(=1)-th bit in the memory chip 31 is non-defective, as illustrated in FIG. 16A, and accordingly A(1) in Table 3 is set to 0. When N=2, the N(=2)-th bit in the memory chip 31 is defective, and accordingly A(2) is set to L(=2). Subsequently, the value of the index L is set to 4 which corresponds to the next non-defective bit 3 in the memory chip 32.

At step S58, the inspection unit determines if the count in the counter N is equal to 8, which corresponds to the last input/output terminal DQ7' of the memory chip 31. A decision is rendered in accordance with the result of such determination at step S59. If N is equal to 8, the operation proceeds to step S60. If N is less than 8, the operation returns to step S52, thus repeating the operations in a loop from step S52 to step S58. In this manner, the count in the counter N is incremented by one, sequentially obtaining A(N). When N=8, the A(N) corresponding to each N is obtained as shown in Table 3 and illustrated in FIG. 16C.

At step S60, the inspection unit checks whether any value of A(N) other than 0 occurs more than once. If not, the operation proceeds to step S70 shown in FIG. 18. If the same non-zero value occurs more than once, the count in the counter M is incremented by 1 at step S62, and the resulting count is compared with a number which has been determined as an upper limit of errors at step S63, whereupon the operation proceeds to step S64. At step S64, the inspection unit renders a decision upon the result of the comparison. If M does not exceed the upper limit, the operation returns to step S51, repeating the operations from step S51 to step S60 again to set up A(N). During normal operation, if a total number of non-defective bits in the memory chips 31 and 32 is equal to or greater than eight, the same non-zero value of A(N) can not occur more than once at step S60. However, an error in setting up A(N) is conceivable, so providing the processing operations in steps S61 to S65 are provided. If M exceeds the predetermined upper limit, the operation halts. In this manner, erroneously switching to a redundant bit or bits as a result of an erroneous A(N) can be prevented.

Figure 18:
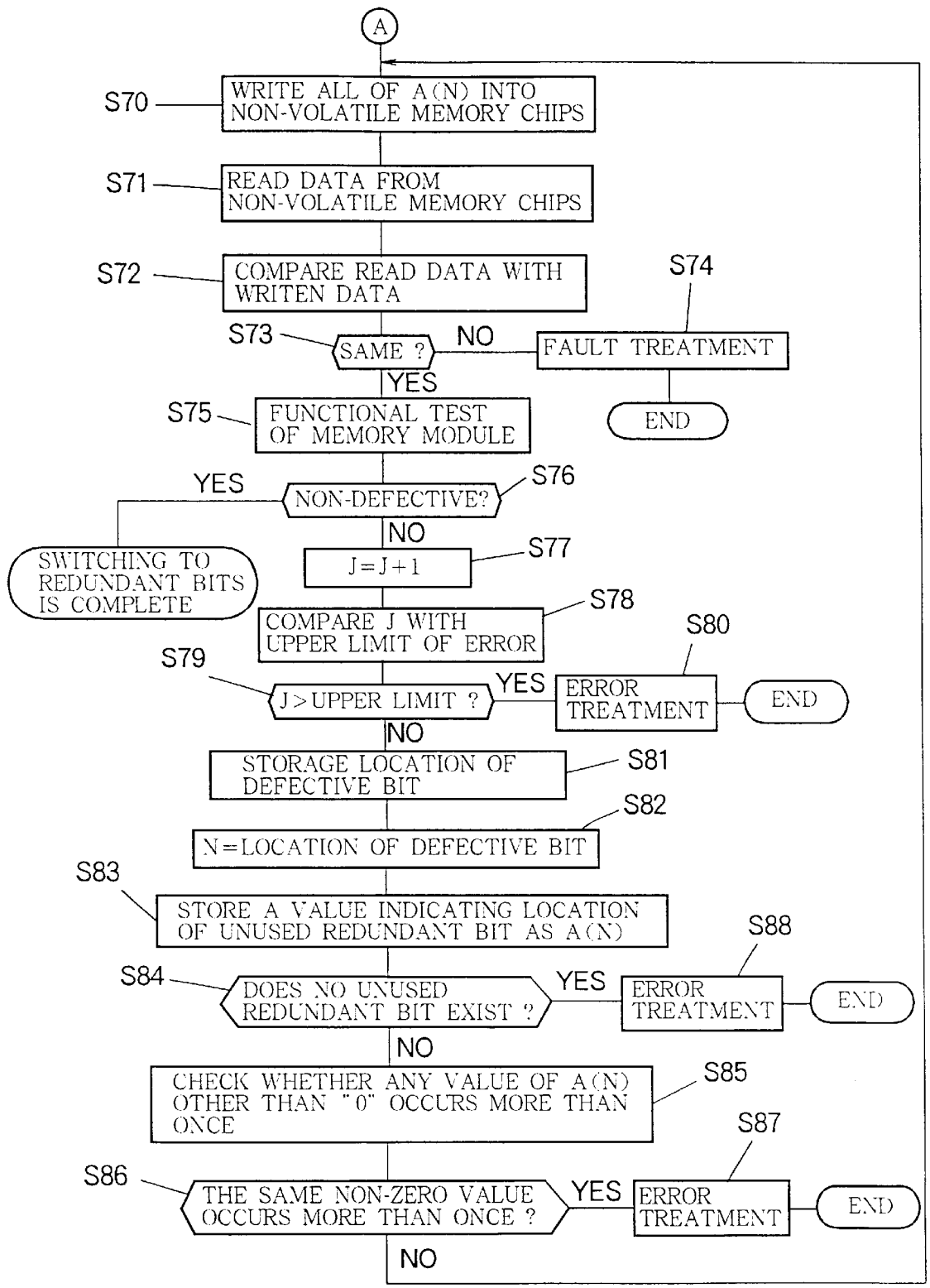
FIG. 18 is a similar flow chart illustrating a replacement of defective bits in the memory module by redundant bits.

Upon completing the set-up of A(N), the inspection unit proceeds to step S70 shown in FIG. 18 where data A(N) is fed through the serial input/output terminal 19a and the shift register 69 shown in FIG. 12, to write into the individual non-volatile memory chips 51 to 58, whereupon the operation proceeds to step S71. As a result of this, for A(N) illustrated in FIG. 16C, for example, 0, 2, 4, 0, 0, 5, 6, and 0 are written into the non-volatile memory chips 51 to 58, respectively. According to such data, the selection circuits 41, 44, 45, and 48 shown in FIG. 9 connect the corresponding input/output terminals DQ0', DQ3', DQ4', and DQ7' of the memory chip 31 to the terminals DQ0, DQ3, DQ4 and DQ7 of the external board terminal 33, and the selection circuits 42, 43, 46, and 47 connect the input/output terminals DQ1', DQ3', DQ4', and DQ5' of the memory chip 32, which correspond to data supplied as "2", "4", "5", and "6" to the terminals DQ1, DQ2, DQ5, and DQ6 of the external board terminal 33. In this manner, the input/output terminals DQ1', DQ2', DQ5', and DQ6' for the defective bits in the memory chip 31 are replaced by the input/output terminals DQ1' and DQ3' to DQ5' for the non-defective bits in the memory chip 32, which are redundant bits. In this manner, only non-defective bits in the memory chips 31 and 32 are connected to the terminals DQ0 to DQ7 of the external board terminal 33, allowing these memory chips to be used as a normal memory module.

At steps S71 to S74, data is read from the non-volatile memory chips 51 to 58, and the read data is compared with the written data. If the read data do not coincide with the written data, a fault treatment, such as providing an indication to this effect, is made at step S74, in a manner similar to that at steps S25 to S28. The operation then ends. If the read data coincide with the written data, the operation proceeds to step S75.

At step S75, the inspection unit performs a data write/read test with respect to the memory module for which switching to the redundant bits has been completed at step S70, and it renders a decision upon the result of the test at step S76. If the operation of the memory module is proper, switching to the redundant bits is completed. However, if the operation of the memory module is faulty, the operation proceeds to step S77, and switching to the redundant bits is tried again at steps S77 to S86.

Specifically, at step S77, the inspection unit increments a counter J, which counts the number of times switching to the redundant bits has been attempted, by 1, and at step S78, it compares the count in the counter J with an upper limit set for the number of repeated switchings. A decision is rendered upon a result of the comparison at step S79. If the count in the counter J is greater than the upper limit for the number of repeated switchings, the inspection unit performs a treatment such as indicating the occurrence of an error at step S80, where the operation ends. If the count in the counter J is equal to or less than the upper limit, the operation proceeds to step S81.

At step S81, the inspection unit stores the locations of bits which were found defective during a memory test at step S75 in a defective location table, and at step S82, it regards the count in the counter N as a value indicating the location of a defective bit. At step S83, the inspection unit refers to Tables 1 and 2, and if there are unused redundant bits remaining in the memory chip 32, a value indicating the location of such redundant bit (or bits) is written into Table 3 as A(N), whereupon the operation proceeds to step S84. At this time, if there is no unused redundant bit remaining in the memory chip 32, the operation proceeds from step S84 to step S88, where a treatment such as indicating the occurrence of an error is made, and the operation then ends.

At step S85, the inspection unit checks whether any value of A(N) other than 0 occurs more than once. If not, the operation returns from the step S86 to S70, repeating the operations in a loop from step S70 to step S75. If the same non-zero value occurs more than once, an error treatment, such as indicating to the effect that the memory module which is being currently examined is defective, is made at step S87, and the operation then ends.

In this manner, by performing repeated switching to redundant bits, if a defect occurred in a bit which is once assigned, a normally operating memory module can still be constructed as long as there is an allowance in the number of redundant bits remaining in the memory chip 32. Accordingly, the yield of the memory module can be improved as compared with an arrangement in which repeated switching to the redundant bits is not made.

As described, the memory module according to the fourth embodiment allows input/output terminals DQ0' to DQ7' of the memory chip 31 to be replaced by arbitrary input/output terminals DQ0' to DQ7' of the memory chip 32, so that if the memory chip 31 contains a plurality of defective bits, a properly operating memory module can still be constructed by replacing the defective bits, by redundant bits as long as there are a number of redundant bits remaining in the memory chip 32 which is equal to or greater than the number of defective bits in the memory chip 31. Thus, such a memory module can be constructed with memory chips which contain a plurality of defects and which therefore had to be destroyed or scrapped in the prior art practice, thus allowing a reduction in the manufacturing cost.

The switching controller 34 need not be restricted to the arrangement shown in FIG. 12. Any other arrangement which permits redundant data (or switching data) to be written into or read from non-volatile memory chip 34a and which delivers the redundant data from the non-volatile memory chip 34a upon turning on the power to operate the selection circuits 41 to 48 to assure the operation of a normal memory module without attendant problems may be used. As an example, an arrangement as shown in FIG. 19 may be used.

Figure 19:
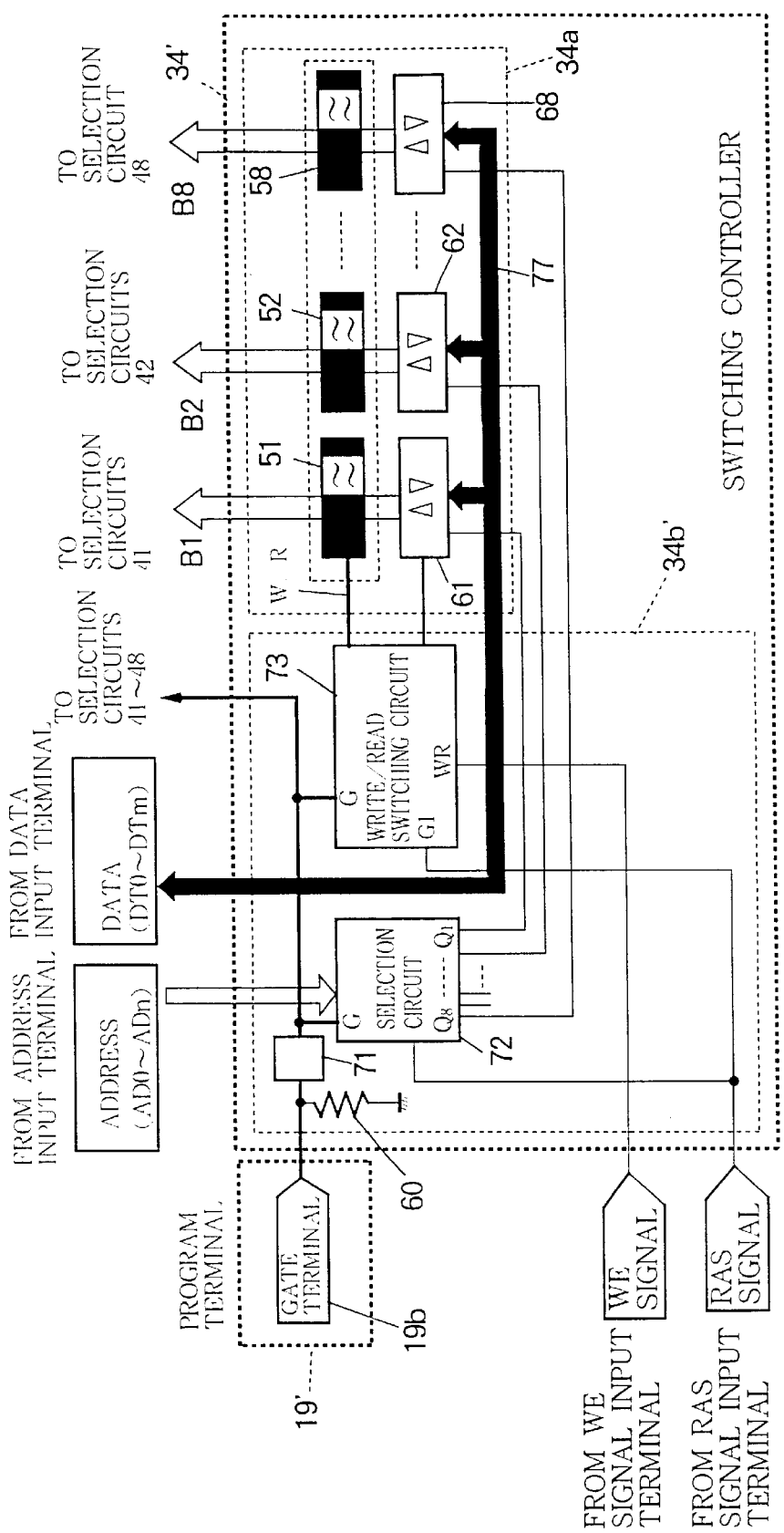
FIG. 19 is a block diagram of a modification of a switching controller which forms the memory module.

FIG. 19 shows a switching controller 34' that is similar to the switching controller 34 shown in FIG. 12 and includes non-volatile memory chips 51 to 58 and bidirectional buffers 61 to 68. In the switching controller 34 shown in FIG. 12, data that is provided to the serial input/output terminal 19a is shifted through the shift register 69 to be supplied to non-volatile memory chips 51 to 58 through the bidirectional buffers 61 to 68, respectively. However, in the switching controller 34' shown in FIG. 19, in order to reduce the number of terminals used in the program terminal 19, data in the non-volatile memory chips 51 to 58 is set up on the basis of addresses AD0 to ADn and data DT0 to DTm, which are input through an address input terminal and data input/output terminals (corresponding to terminals DQ0 to DQ7) formed on the external board terminal 33.

Specifically, the switching controller 34' comprises a selection circuit 72 which receives address signals AD0 to ADn which are provided through an address input terminal as data therein in response a latch (RE) signal which is provided through an RAS (Row Address Strobe) signal input terminal formed on the external board terminal 33 and which delivers a selection signal in accordance with the signal arrangement of addresses AD0 to ADn, a switching circuit 73 which responds to a WR signal inputted through a write enable (WE) signal input terminal to command a write/read operation to non-volatile memory chips 51 to 58 and the bidirectional buffers 61 to 68, and a circuit 71 which cannot deliver a high level signal unless a high level signal is fed thereto for a given time interval from a program terminal.

In the switching controller 34', data is set up in the non-volatile memory chips 51 to 58 through the address input terminal and data input/output terminals, and accordingly the program terminal 19' only comprises a gate terminal 19b which is used to receive a gate signal G, thus dispensing with a serial input/output terminal 19a which is used to receive or provide serial data, and a clock input terminal 19c which is used to receive a clock.

Figure 20A:
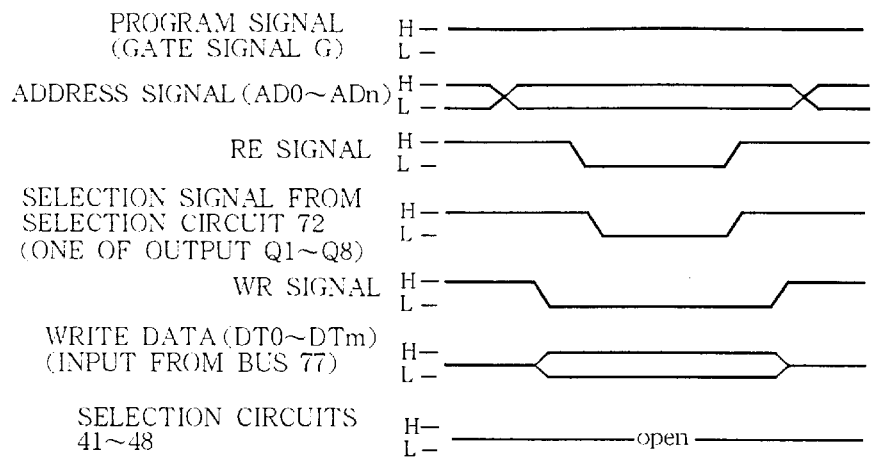
FIGS. 20A, 20B and 20C are a series of waveform diagrams illustrating the operation of the redundant bit write/read circuit which form the switching controller.

In the switching controller 34' thus constructed, when setting up data in non-volatile memory chips 51 to 58 by an inspection unit as mentioned above, a gate signal G supplied to the gate terminal 19b is brought to its high level, an address and data are supplied through the address input terminal and data input terminal, and WR and RE signals are made effective (low level), as illustrated in FIG. 20A, whereby the selection circuit 72 selects one of the bidirectional buffers 61 to 68 and one of non-volatile memory chips 51 to 58, and input data DT0 to DTm is supplied to the selected buffer through a bus 77 so as to be written into a particular one of the non-volatile memory chips 51 to 58, which is connected to the selected buffer.

Figure 20B:
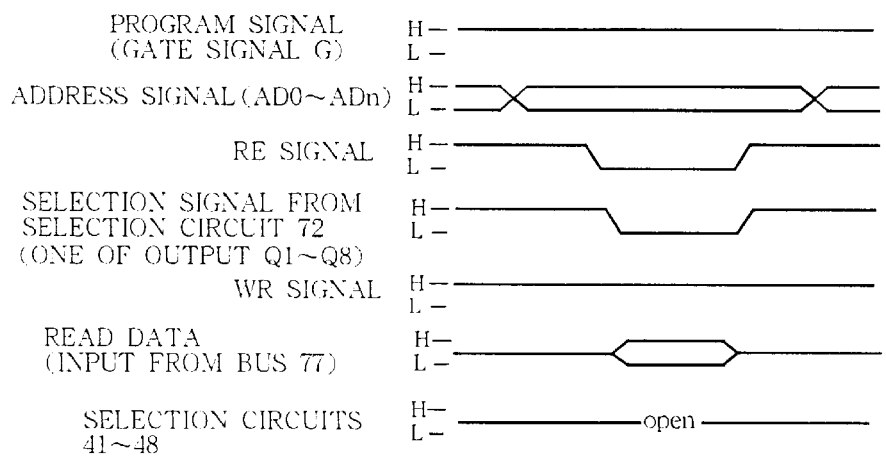

When the inspection unit reads stored data from the respective non-volatile memory chips 51 to 58, the gate signal G is brought to its high level, address an is supplied to the address input terminal, the WR signal is made invalid (high level) and the RE signal is made effective (low level), as shown in FIG. 20B, whereby the selection circuit 72 selects one of the bidirectional buffers 61 to 68 and one of the non-volatile memory chips 51 to 58, and data is delivered from a particular one of the non-volatile memory chips 51 to 58, which is connected to the selected bidirectional buffer, the data being conveyed on the bus 77 to the data input/output terminal.

Figure 20C:
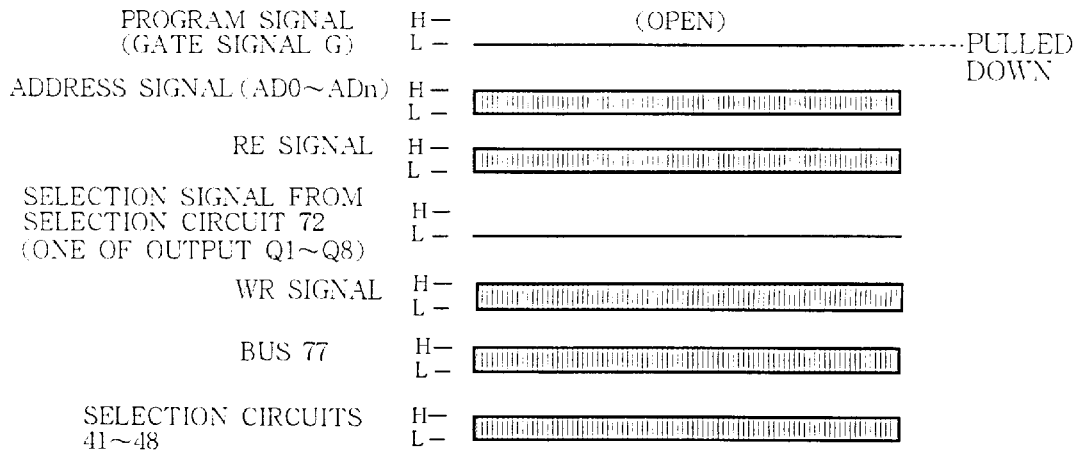

When this memory module is mounted in an information processing system and a normal write/read operation takes place, no connection is made to the program terminal 19b, which is not supplied with a voltage. Accordingly, as shown in FIG. 20C, the gate signal G is brought to its low level by a pull-down resistor 60, and hence the selection circuit 72 renders all the bidirectional buffers 61 to 68 non-selected, whereby the write/read circuit 73 enables all the non-volatile memory chips 51 to 58 to deliver the redundant data. Accordingly, a data write/read operation through the bus 77 is disabled, and the redundant data from the non-volatile memory chips 51 to 58 are supplied to the selection circuits 41 to 48, and the memory module operates in the same manner as a usual memory module.

It will thus be seen that the switching controller 34' is constructed so that data to be written into the non-volatile memory chips 51 to 58 are received through the address input terminal and data input/output terminals which are usually provided on a memory module. Therefore, the number of terminals used in the program terminal 19 can be reduced as compared with the switching controller 34 as shown in FIG. 12.

In addition, in the switching controller 34', an input of data written into the non-volatile memory chips 51 to 58 or a data read therefrom takes place in parallel through the data input/output terminals. Hence, the data access time can be reduced as compared with the arrangement as shown in FIG. 12, in which data to be written into the non-volatile memory chips 51 to 58 is formed as a serial signal.

In the arrangement shown in FIG. 19, the number of required program terminal 19' is one, and where the number of program devoted control terminals 19' is small (for example, in a range from one to four), a non-connect (NC)

terminal or terminals on the external board terminal 33 mounted on a memory module which are not used during a normal operation may be utilized as the program devoted control terminal 19'. Such NC terminal may be normally maintained as connected to the switching controller 34' to serve as the program devoted control terminal 19'. However, in order to prevent an erroneous operation during normal use, it is desirable that the NC terminal be disconnected from the switching controller 34' subsequent to the completion of the programming operation.

Figure 21:
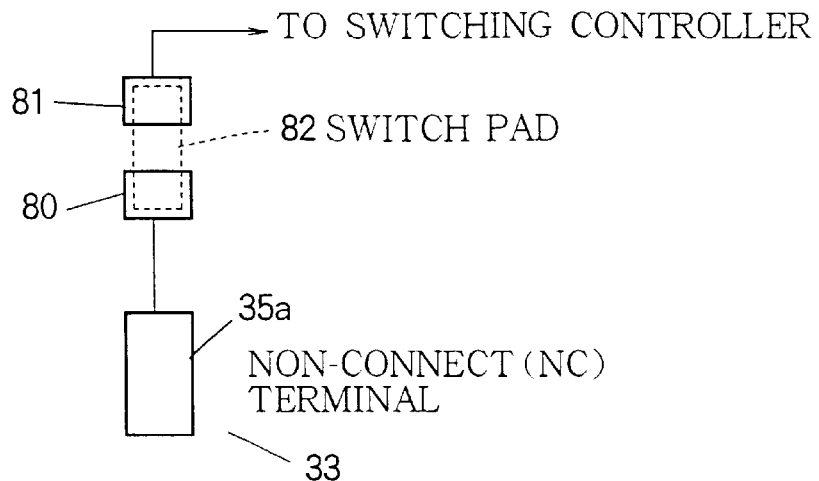
FIG. 21 is a schematic view of a program devoted control terminal which is used in the memory module.

Referring to FIG. 21, which illustrates an example, a pad 80 connected to the NC terminal on the external board terminal 33, and another pad 81 located close to the pad 80 and connected to the switching controller 34', may be provided on a wiring pattern which is laid on the printed circuit board, and when a programming operation takes place, a conductive member 82 similar to a jumper chip 6 as used in the first embodiment may be used to provide an electrical short-circuit between the pads 80, 81, thereby connecting the NC terminal to the switching controller 34'. Subsequent to the completion of the programming operation, the conductive member 82 may be removed to disconnect the NC terminal from the switching controller 34'. When the switching controller 34' is connected to the NC terminal on the external board terminal 33 during the programming operation and is disconnected therefrom upon completion of the programming operation, the possibility that an erroneous operation may be caused by the influence of noise during a normal write/read operation can be reduced.

Figure 22:
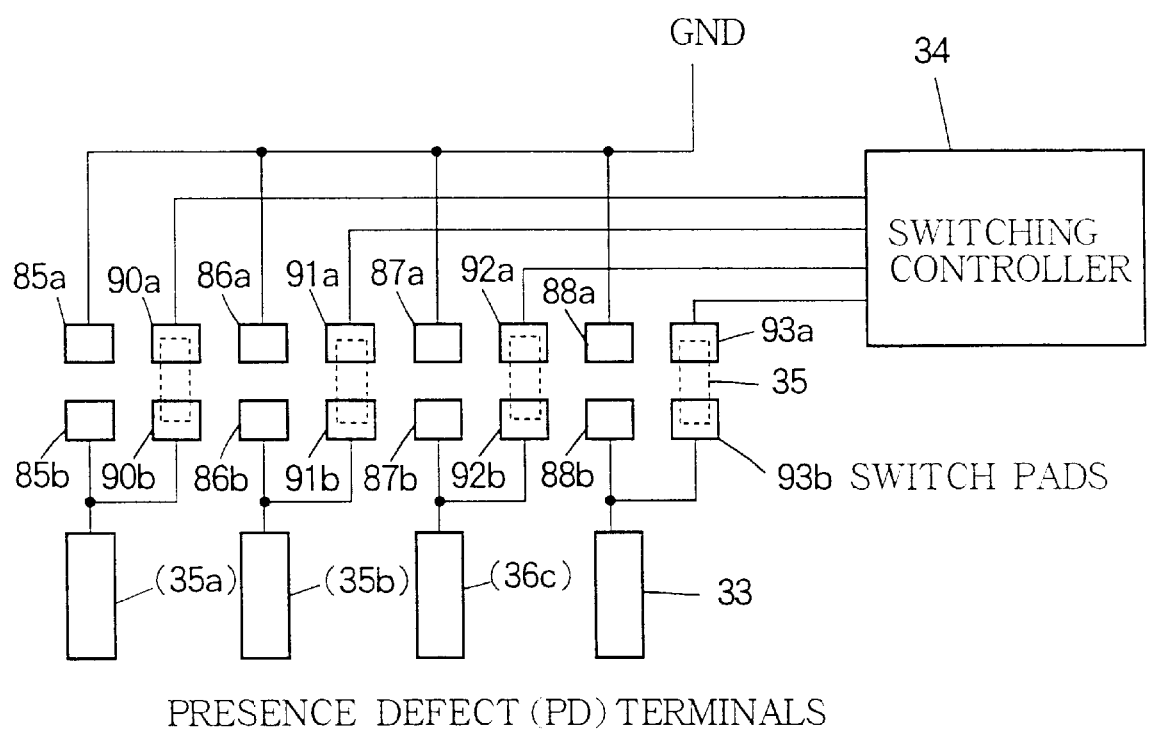
FIG. 22 is a schematic view of a modification of the program devoted control terminal.

As is known, a memory module including an external board terminal having 72 or more pins is provided with presence defect terminals which allow a system utilizing such memory module to recognize information representing the construction of the memory module such as access speed, capacity, or the like. Information is established on these presence defect terminals by connecting individual terminals to the ground potential of the memory module as by printed patterns or leaving the terminals open. Since the purpose of these presence terminals is to enable automatic recognition by an information processing system which utilizes such memory module of the access speed, capacity, or the like of the memory module mounted therein, and they are not contemplated to be used in a program operation of the switching controller 34'. However, during a programming operation, such terminals may be utilized as terminals 19a to 19c of the program terminal 19. As specifically illustrated in FIG. 22, pads 90a (90b) to 93a (93b) which are used to provide a connection between the external board terminal 33 and the switching controller 34, may be disposed on the printed circuit board which constitutes the memory module at locations close to inherent pads 85a (85b) to 88a (88b) used as the presence defect terminals.

When a programming operation takes place, conductive members such as jumper chips 6 used in the first embodiment are used to connect between pads 90a to 93a and pads 90b to 93b. Then, portions which are equivalent to the presence defect terminals on the external board terminals 33 function in the same way as the terminals 19a to 19c of the program terminal 19.

Subsequent to the completion of the programming operation, the conductive members between the pads 90a to 93a and the pads 90b to 93b are removed, and given combinations of pads 85a to 88a and pads 85b to 88b, which are provided for use as presence defect terminals, are connected together by conductive members, allowing the terminals to which these pads 85b to 88b are connected to function as presence defect terminals.

In this manner, when an arrangement is made to utilize the presence defect terminals which are generally provided as programming devoted control terminals during a programming operation, the need for separate provision of programming devoted control terminals may be eliminated to achieve a reduction in the number of terminals required for a memory module.

Alternatively, instead of the non-volatile memory chips 51 to 58 and the bidirectional buffers 61 to 68 of the switching controller 34', a semiconductor memory chip such as a serial EEPROM, namely, an EEPROM capable of serial input/output operation, may be provided on a memory module for storage of identification codes and input/output control so that a read/write operation of the identification codes may be controlled in accordance with an operation controlling command which is supplied from an information processing system which utilizes the memory module, through such a serial input/output terminal. In such instance, preferably, input/output of data through the serial input/output terminal takes place in synchronism with a clock which is fed through a terminal similar to the clock input terminal 19c mentioned above.

When such an arrangement is employed, a switching circuit may be provided to enable data access to the switching controller 34 when a special code other than an operation controlling command or identification code is supplied thereto from the information processing system through the serial input/output terminal.

Additionally, a terminal which is equivalent to the gate terminal 19b may be provided so that a switching circuit responds to a switching signal which is fed through the program terminal to perform data access to the switching controller 34 through the serial input/output terminal mentioned above or the clock input terminal.

What is claimed is:

1. A terminal mapping apparatus for mapping circuit terminals and external terminals of a circuit board, comprising:

an intermediate terminal arrangement coupled to the circuit terminals and the external terminals; and a jumper for connection to the intermediate terminal arrangement;

wherein the intermediate terminal arrangement includes first intermediate terminals connected to the circuit terminals and not connected to the external terminals, and second intermediate terminals connected to the external terminals and not connected to the circuit terminals;

wherein the jumper includes connectors for connecting selected first intermediate terminals to selected second intermediate terminals when the jumper is connected to the intermediate terminal arrangement;

wherein each said connector has a plurality of ends;

wherein the jumper includes jumper terminals that are arranged in jumper groups;

wherein each said connector is connected to the jumper terminals in a corresponding one of said jumper groups such that each said end of each said connector is connected to a corresponding jumper terminal in the corresponding one of said jumper groups; and wherein the intermediate terminal arrangement includes mapping groups of mapping terminals, wherein each mapping group includes one mapping terminal that is one of said first intermediate terminals and one mapping terminal that is one of said second intermediate terminals;

such that each mapping terminal in each mapping group is connected to a jumper terminal in a corresponding jumper group, when the jumper is connected to the intermediate terminal arrangement.

2. The apparatus of claim 1, wherein the intermediate terminal arrangement includes a null group of terminals, wherein each terminal in said null group is connected to neither a circuit terminal nor an external terminal.

3. The apparatus of claim 1, wherein the jumper includes a null terminal that is not connected to a connector.

4. The apparatus of claim 3, wherein a number of circuit terminals exceeds a number of external terminals.

5. The apparatus of claim 4, wherein the intermediate terminal arrangement includes a common terminal that is connected to one terminal in each mapping group and to one circuit terminal, wherein the one circuit terminal is not connected to a mapping terminal.

6. The apparatus of claim 5, wherein the position of the jumper with respect to connection to the intermediate terminal arrangement is changeable such that a selected circuit terminal does not connect to any external terminal, when the jumper is connected to the intermediate terminal arrangement.

7. A memory module, comprising
the terminal mapping apparatus of claim 1; and
a memory chip having leads connected to corresponding circuit terminals of the terminal mapping apparatus.

8. A terminal mapping apparatus for mapping circuit terminals and external terminals of a circuit board, comprising:
a switching unit for enabling connections between selected circuit terminals and selected external terminals, under control of a switching command;
a switching controller for generating the switching command based on switching data and for providing the switching command to the switching unit; and
a program terminal for providing the switching data, corresponding to circuit components connected to the circuit terminals, to the switching controller;
wherein the switching unit comprises:
a plurality of switches which electrically connect corresponding ones of the circuit terminals and the external terminals when closed; and
a logic circuit for controlling closing of individual ones of the plurality of switches, based on the switching command;
wherein a number of the circuit terminals is one greater than a number of the external terminals;
wherein the plurality of switches includes a first plurality of switches equal in number to the number of external terminals, and a second plurality of switches equal in number to the number of external terminals, each of the first plurality of switches being connected to a corresponding one of the second plurality of switches;
wherein the switching unit further includes a plurality of gates equal in number to the number of external terminals, each of the plurality of gates being connected to one of the first plurality of switches, to one of the second plurality of switches, and to the logic circuit;
wherein each of the external terminals is connected to a corresponding one of the first plurality of switches and each of the first plurality of switches is connected to a corresponding one of the circuit terminals, leaving a remainder circuit terminal not directly connected to any of the first plurality of switches;
wherein the remainder circuit terminal is connected to each of the second plurality of switches; and
wherein selective electrical connection exists between the external terminals and the circuit terminals such that
if one of the first plurality of switches is closed, the external terminal and the circuit terminal connected to said one of the first plurality of switches are electrically connected,
if one of the first plurality of switches is open, the external terminal and the circuit terminal connected to said one of the first plurality of switches are not electrically connected, and
if one of the first plurality of switches is open and said one of the second plurality of switches connected to said one of the first plurality of switches is closed, the external terminal connected to said one of the first plurality of switches and the remainder circuit terminal are electrically connected.

9. The apparatus of claim 8, wherein the switching controller includes
an EPROM for storing identification codes and providing the switching command, according to an operation control command; and
an input terminal for receiving the operation control command.

10. The apparatus of claim 9, wherein the input terminal is one of the external terminals.

11. The apparatus of claim 9, wherein the input terminal is connected to a presence defect terminal by a removable jumper.

12. A memory module, comprising
the terminal mapping apparatus of claim 8; and
a memory chip having leads connected to corresponding circuit terminals of the terminal mapping apparatus.

13. A terminal mapping apparatus for mapping circuit terminals and external terminals of a circuit board, comprising:
a switching unit for enabling connections between selected circuit terminals and selected external terminals, under control of a switching command;
a switching controller for generating the switching command based on switching data and for providing the switching command to the switching unit; and
a program terminal for providing the switching data, corresponding to circuit components connected to the circuit terminals, to the switching controller;
wherein the switching controller includes non-volatile memory for storing the switching command, and a transfer circuit for controlling reception of switching data and provision of the switching command by the switching controller;
wherein the transfer circuit includes a shift register, and gating means connected between the shift register and the non-volatile memory; and
wherein the program terminal includes a data terminal by which the shift register receives the switching data, and a gate terminal for receiving a gate signal and providing the gate signal to the non-volatile memory and the gating means, for controlling the provision of the switching data from the shift register to the non-volatile memory and of the switching command from the non-volatile memory to the switching unit.

14. A terminal mapping apparatus for mapping circuit terminals and external terminals of a circuit board, comprising:
- a switching unit for enabling connections between selected circuit terminals and selected external terminals, under control of a switching command;
- a switching controller for generating the switching command based on switching data and for providing the switching command to the switching unit; and
- a program terminal for providing the switching data, corresponding to circuit components connected to the circuit terminals, to the switching controller;
- wherein the switching controller includes non-volatile memory for storing the switching command, and a transfer circuit for controlling reception of switching data and provision of the switching command by the switching controller;
- wherein the transfer circuit includes selection circuitry for receiving an address from the external terminals, and gating means for receiving the address from the selection circuitry, for receiving the switching data from the external terminals, and for providing the switching data to the non-volatile memory according to the address; and
- wherein the program terminal includes a gate terminal for receiving a gate signal and providing the gate signal to the non-volatile memory and the gating means, for controlling the provision of the switching data from the gating means to the non-volatile memory and of the switching command from the non-volatile memory to the switching unit.

* * * * *